(12) United States Patent
Kim et al.

(10) Patent No.: US 12,707,622 B2
(45) Date of Patent: Aug. 11, 2026

(54) SEMICONDUCTOR DEVICE

(71) Applicant: Samsung Electronics Co., Ltd., Suwon-si (KR)

(72) Inventors: Jee Woong Kim, Suwon-si (KR); Kyung Hee Cho, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 440 days.

(21) Appl. No.: 18/522,663

(22) Filed: Nov. 29, 2023

(65) Prior Publication Data

US 2024/0414908 A1 Dec. 12, 2024

(30) Foreign Application Priority Data

Jun. 7, 2023 (KR) ........................ 10-2023-0072747

(51) Int. Cl.
*H10B 10/00* (2023.01)

(52) U.S. Cl.
CPC .................................. *H10B 10/125* (2023.02)

(58) Field of Classification Search
CPC ..... H10B 10/125; H10D 89/10; H10D 84/856
See application file for complete search history.

(56) References Cited

U.S. PATENT DOCUMENTS

| | | | |
|---|---|---|---|
| 9,997,598 B2 | 6/2018 | Smith et al. | |
| 10,818,674 B2 | 10/2020 | Mann et al. | |
| 2020/0402984 A1* | 12/2020 | Reznicek | H10B 43/35 |
| 2021/0202500 A1 | 7/2021 | Chanemougame et al. | |
| 2022/0108992 A1 | 4/2022 | Yamagami | |
| 2022/0115388 A1 | 4/2022 | Hirose | |
| 2022/0246623 A1 | 8/2022 | Hwang et al. | |
| 2022/0285395 A1* | 9/2022 | Yang | H10B 51/30 |
| 2022/0302121 A1 | 9/2022 | Gutwin et al. | |
| 2022/0302134 A1 | 9/2022 | Hwang et al. | |
| 2023/0056640 A1* | 2/2023 | Sharma | G11C 11/005 |

* cited by examiner

*Primary Examiner* — Errol V Fernandes
(74) *Attorney, Agent, or Firm* — Wolf, Greenfield & Sacks, P.C.

(57) ABSTRACT

A semiconductor device includes a first lower active pattern and a second lower active pattern, a first upper active pattern and a second upper active pattern, a first gate electrode that overlaps the first lower active pattern and the first upper active pattern, a second gate electrode spaced apart from the first gate electrode, a third gate electrode spaced apart from the first gate electrode, a fourth gate electrode spaced apart from the third gate electrode, a first lower source/drain contact that is electrically connected to the first lower active pattern, a first upper source/drain contact that is electrically connected to the second upper active pattern, a lower shared contact in the lower region, and an upper shared contact in the upper region.

20 Claims, 17 Drawing Sheets

MA1
MC1
181B
191
185
188
183B
MA2
D2
D1
MC2
292
187
III
D4
D3
MD1
MB
MD2
PD1
PD2
PS1
SC2
PS2
186
II
I
PU2
PU1
183A
SC1
184
181A
Y
X
Z

SEMICONDUCTOR DEVICE

CROSS-REFERENCE TO RELATED APPLICATION

This application claims priority from Korean Patent Application No. 10-2023-0072747 filed on Jun. 7, 2023, in the Korean Intellectual Property Office and all the benefits accruing therefrom under 35 U.S.C. 119, the contents of which in its entirety are herein incorporated by reference.

TECHNICAL FIELD

The present disclosure relates to a semiconductor device, and more particularly, to a semiconductor device that includes a stacked multi-gate transistor.

BACKGROUND

As one of the scaling techniques for increasing a density of an integrated circuit device, a multi-gate transistor for forming a silicon body of a fin or nanowire shape on a substrate and forming a gate on a surface of the silicon body has been suggested.

Since this multi-gate transistor uses a three-dimensional channel, it is easy to scale the multi-gate transistor. Also, even though a gate length of the multi-gate transistor is not increased, a current control capability may be improved. In addition, a short channel effect (SCE) in which a potential of a channel region is affected by a drain voltage may be suppressed effectively.

SUMMARY

An object of the present disclosure is to provide a semiconductor device in which the degree of freedom in design and the degree of integration are improved.

The objects of the present disclosure are not limited to those mentioned above and additional objects of the present disclosure, which are not mentioned herein, will be clearly understood by those skilled in the art from the following description of the present disclosure.

According to aspects of the present disclosure, a semiconductor device includes a lower region and an upper region on a substrate, and the semiconductor device may include: a first lower active pattern and a second lower active pattern that extend in a first direction, extend in the lower region, and are spaced apart from each other in a second direction that intersects the first direction; a first upper active pattern and a second upper active pattern that extend in the first direction, extend in the upper region, and are spaced apart from each other in the second direction; a first gate electrode that overlaps the first lower active pattern and the first upper active pattern; a second gate electrode spaced apart from the first gate electrode in the second direction, where the second gate electrode overlaps at least one of the second lower active pattern and the second upper active pattern; a third gate electrode spaced apart from the first gate electrode in the first direction, where the third gate electrode overlaps at least one of the first lower active pattern and the first upper active pattern; a fourth gate electrode spaced apart from the third gate electrode in the second direction, where the fourth gate electrode overlaps the second lower active pattern and the second upper active pattern; a first lower source/drain contact that is electrically connected to the first lower active pattern and is between the first gate electrode and the third gate electrode; a first upper source/drain contact that is electrically connected to the second upper active pattern and is between the second gate electrode and the fourth gate electrode; a lower shared contact in the lower region, where the lower shared contact is electrically connected to the first lower source/drain contact and the fourth gate electrode; and an upper shared contact in the upper region, where the upper shared contact is electrically connected to the first upper source/drain contact and the first gate electrode.

According to aspects of the present disclosure, a semiconductor device may include a lower region and an upper region on a substrate, and the semiconductor device may include: a first lower active pattern and a second lower active pattern that extend in a first direction, extend in the lower region, and are spaced apart from each other in a second direction that intersects the first direction; a first upper active pattern and a second upper active pattern that extend in the first direction, extend in the upper region, and are spaced apart from each other in the second direction; a first gate electrode that overlaps the first lower active pattern and the first upper active pattern; a second gate electrode that overlaps the second lower active pattern and the second upper active pattern, where the second gate electrode does not overlap the first gate electrode in the second direction; a first lower source/drain contact that is electrically connected to the first lower active pattern and is between the first gate electrode and the second gate electrode; a first upper source/drain contact that is electrically connected to the first upper active pattern and on the first lower source/drain contact; a second lower source/drain contact that is spaced apart from the first lower source/drain contact in the second direction and is electrically connected to the second lower active pattern; a second upper source/drain contact spaced apart from the first upper source/drain contact in the second direction and electrically connected to the second upper active pattern; a lower shared contact in the lower region, where the lower shared contact is electrically connected to the first lower source/drain contact and the second gate electrode; and an upper shared contact in the upper region, where the upper shared contact is electrically connected to the second upper source/drain contact and the first gate electrode.

According to aspects of the present disclosure, a semiconductor device may include a substrate; a first active pattern may include a first lower active pattern and a first upper active pattern that are on the substrate, are spaced apart from each other, and extend in a first direction; a second active pattern may include a second lower active pattern and a second upper active pattern that are on the substrate, spaced apart from each other, and extend in the first direction, where the second active pattern is spaced apart from the first active pattern in a second direction that intersects the first direction; a cutting pattern that extends in the first direction and is between the first active pattern and the second active pattern; a first gate structure that extends in the second direction, the first gate structure may include a first gate electrode that overlaps the first active pattern and a second gate electrode that overlaps the second active pattern; a second gate structure that is spaced apart from the first gate structure and extends in the second direction, the second gate structure may include a third gate electrode that overlaps the first active pattern and a fourth gate electrode that overlaps the second active pattern, where the third gate electrode and the fourth gate electrode are separated by the cutting pattern; a first lower source/drain contact that is electrically connected to the first lower active pattern and is between the first gate electrode and the third gate electrode;

a first upper source/drain contact that is electrically connected to the first lower source/drain contact and the first upper active pattern and is on the first lower source/drain contact; a second lower source/drain contact that is electrically connected to the second lower active pattern and is between the second gate electrode and the fourth gate electrode; a second upper source/drain contact that is electrically connected to the second lower source/drain contact and the second upper active pattern and is on the second lower source/drain contact; a lower shared contact that extends in the first direction and is electrically connected to the first lower source/drain contact and the fourth gate electrode; and an upper shared contact that extends in the first direction and is electrically connected to the second upper source/drain contact and the first gate electrode.

BRIEF DESCRIPTION OF THE DRAWINGS

The above and other aspects and features of the present disclosure will become more apparent by describing in detail example embodiments thereof with reference to the attached drawings, in which.

DETAILED DESCRIPTION OF THE DISCLOSURE

Figure 1:
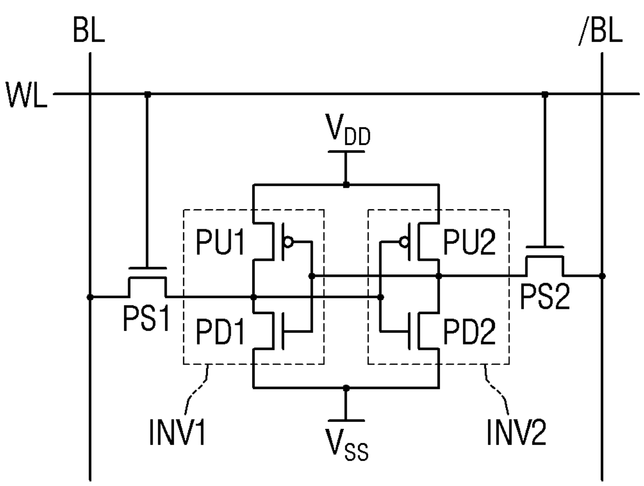
FIG. 1 is an example circuit view illustrating a semiconductor device according to some embodiments of the present disclosure.

To clarify the present disclosure, parts that are not connected with the description will be omitted, and the same elements or equivalents are referred to by the same reference numerals throughout the specification. Further, since sizes and thicknesses of constituent members shown in the accompanying drawings are arbitrarily given for better understanding and ease of description, the present disclosure is not limited to the illustrated sizes and thicknesses. In the drawings, the thickness of layers, films, panels, regions, etc., are exaggerated for clarity. In the drawings, for better understanding and ease of description, thicknesses of some layers and areas are excessively displayed.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, spatially relative terms, such as "beneath," "below," "lower," "above," "upper," and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations), and the spatially relative descriptors used herein may be interpreted accordingly.

In addition, unless explicitly described to the contrary, the word "comprises", and variations such as "comprises" or "comprising", will be understood to imply the inclusion of stated elements but not the exclusion of any other elements. As used herein, the phrase "at least one of A, B, and C" refers to a logical (A OR B OR C) using a non-exclusive logical OR, and should not be construed to mean "at least one of A, at least one of B and at least one of C." As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, steps, operations, elements and/or components, but do not preclude the presence or addition of one or more other features, steps, operations, elements, components and/or groups thereof. The term "and/or" includes any and all combinations of one or more of the associated listed items. The term "connected" may be used herein to refer to a physical and/or electrical connection and may refer to a direct or indirect physical and/or electrical connection.

As used herein, "an element A is at a higher level than element B" or "an element A is at a lower level than element B" refers to at least one surface of element A that is not coplanar with at least one surface of element B and/or at least one surface of element A being spaced apart from a reference element by a different distance than element B and the reference element. As an example, "an element A is at a higher level than element B" refers to element A being spaced apart from a reference element by a greater distance than element B and the reference element. Components or layers described with reference to "overlap" in a particular direction may be at least partially obstructed by one another when viewed along a line extending in the particular direction or in a plane perpendicular to the particular direction.

It will be understood that, although the terms "first", "second", etc. may be used herein to describe various elements or components, these elements or components should not be limited by these terms. These terms are only used to distinguish one element or component from another element or component. Therefore, a first element or component discussed below could be termed a second element or component without departing from the technical spirits of the present disclosure.

Hereinafter, a semiconductor device according to example embodiments will be described with reference to FIGS. 1 to 17. The embodiments disclosed below will be described based on a static random access memory (SRAM) device as a semiconductor device, but the disclosure is not limited thereto. It will be understood by those with ordinary skill in the art that the technical spirits of the present disclosure may be applied to various semiconductor devices, such as a logic device as well as an SRAM device.

Figure 2:
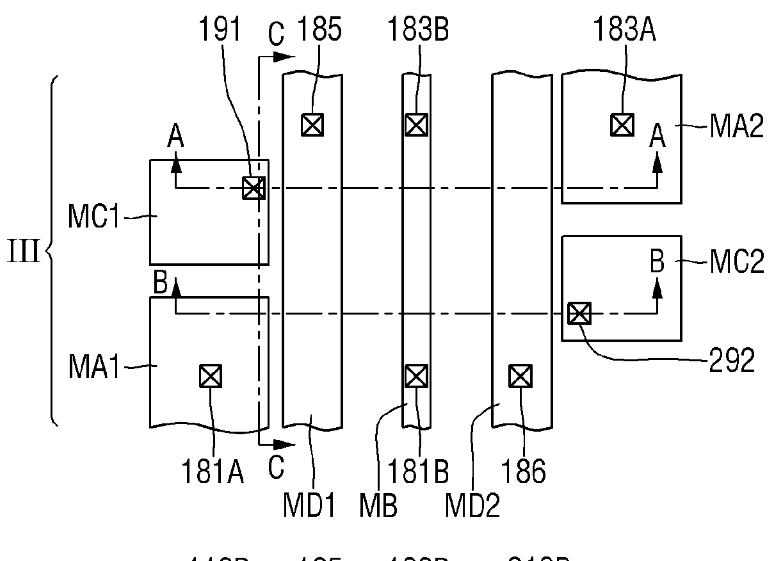
FIG. 2 is an example layout view illustrating a semiconductor device according to some embodiments of the present disclosure.
Figure 2:
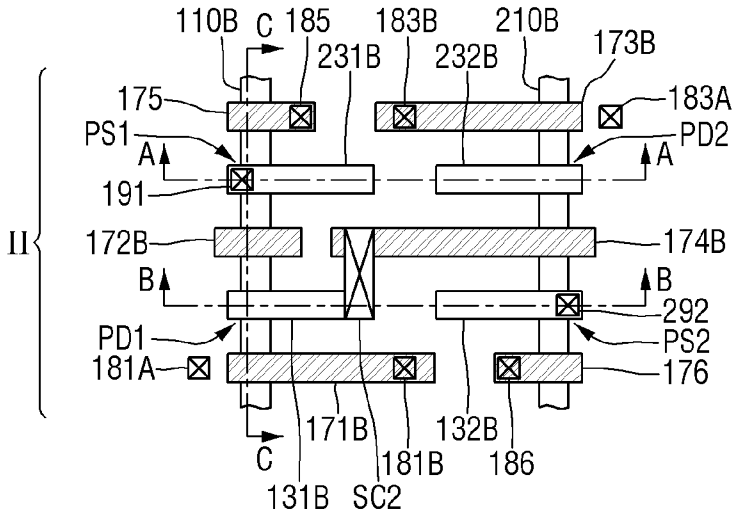
Figure 2:
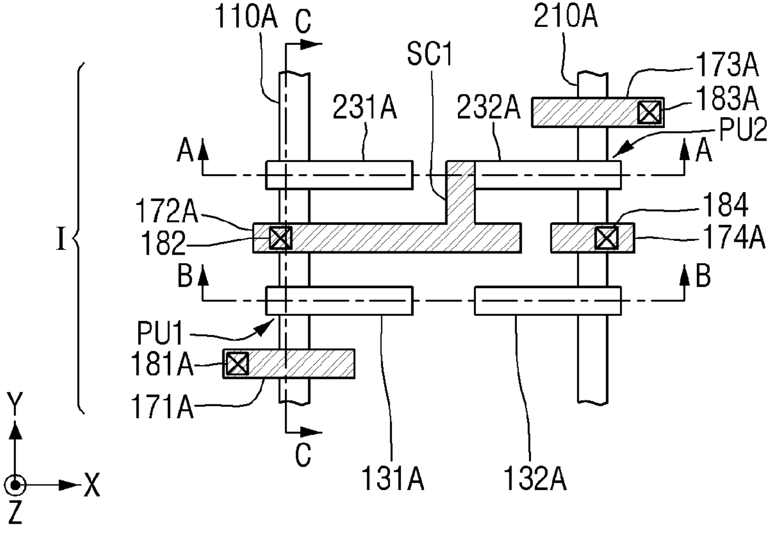
Figure 3:
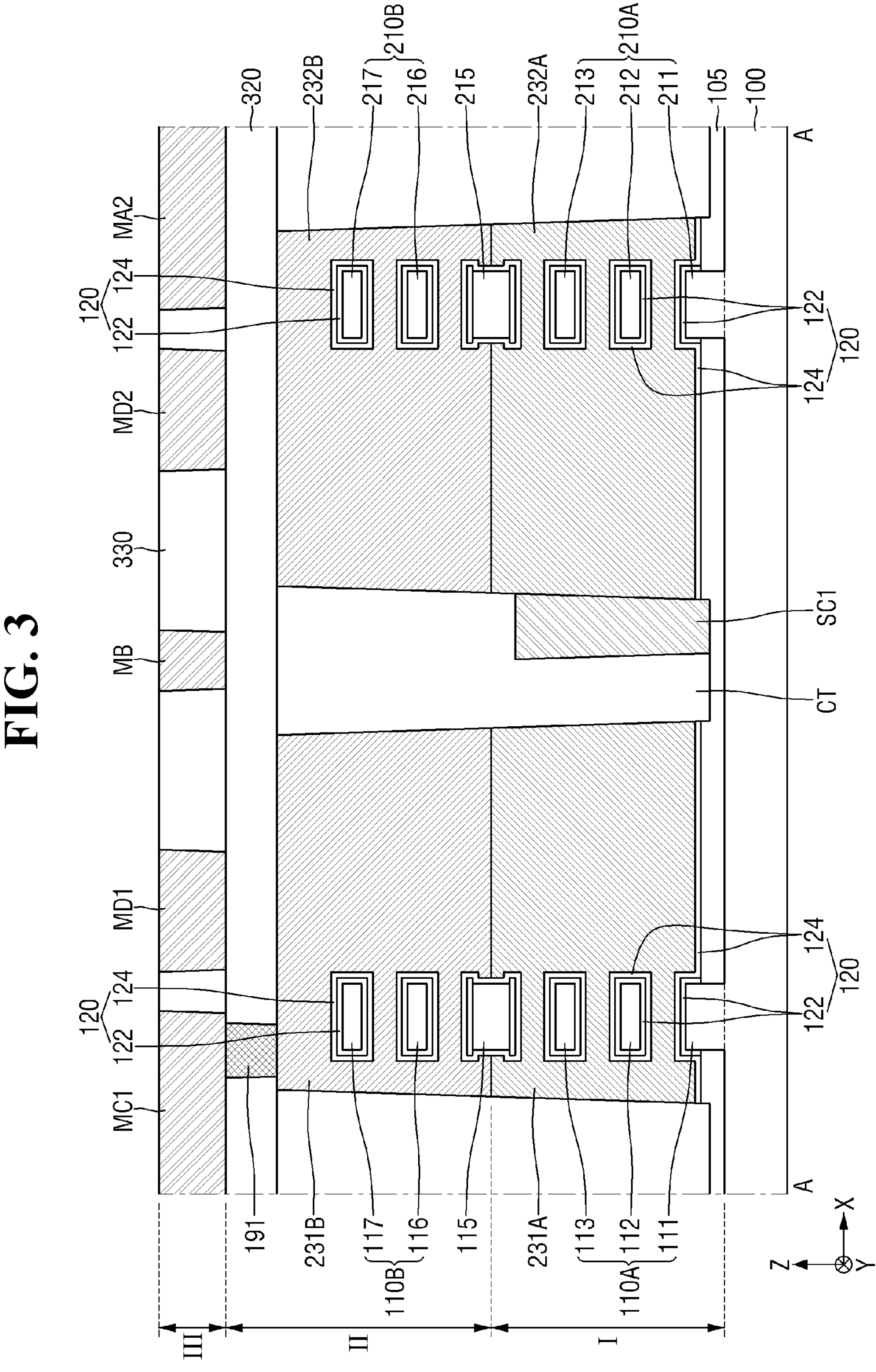
FIG. 3 is a schematic cross-sectional view taken along line A-A of FIG. 2.
Figure 4:
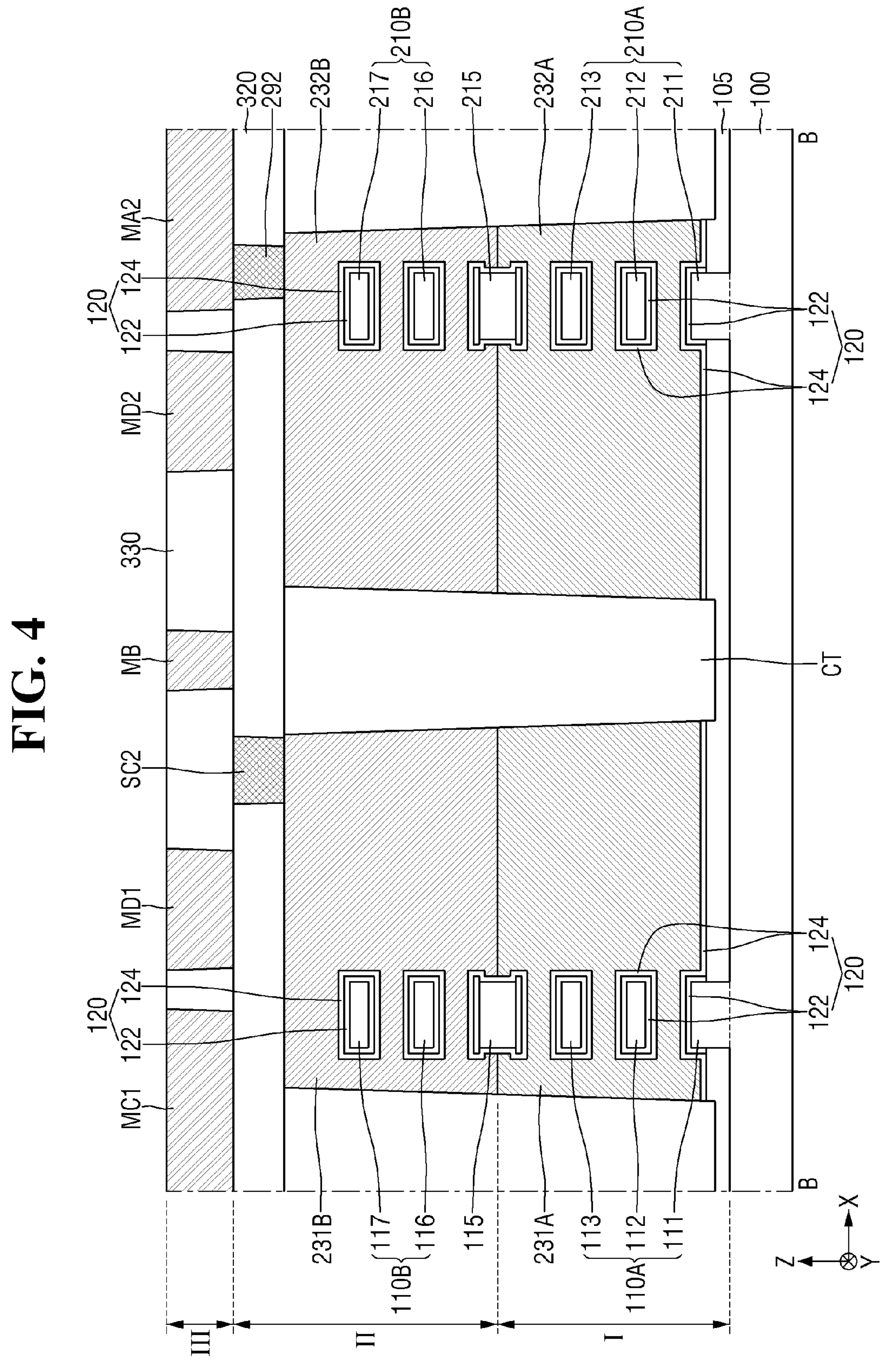
FIG. 4 is a schematic cross-sectional view taken along line B-B of FIG. 2.
Figure 5:
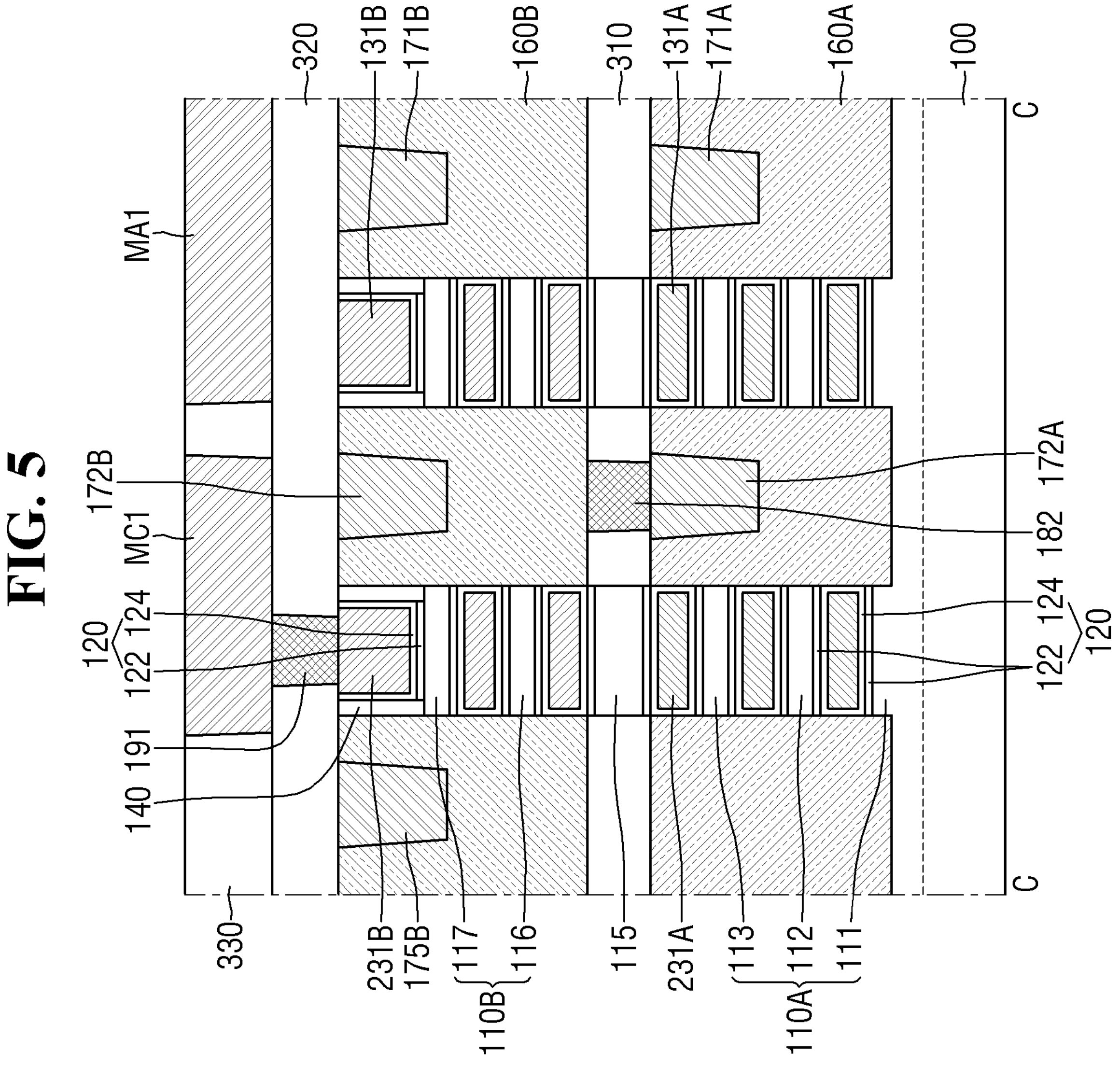
FIG. 5 is a schematic cross-sectional view taken along line C-C of FIG. 2.
Figure 6:
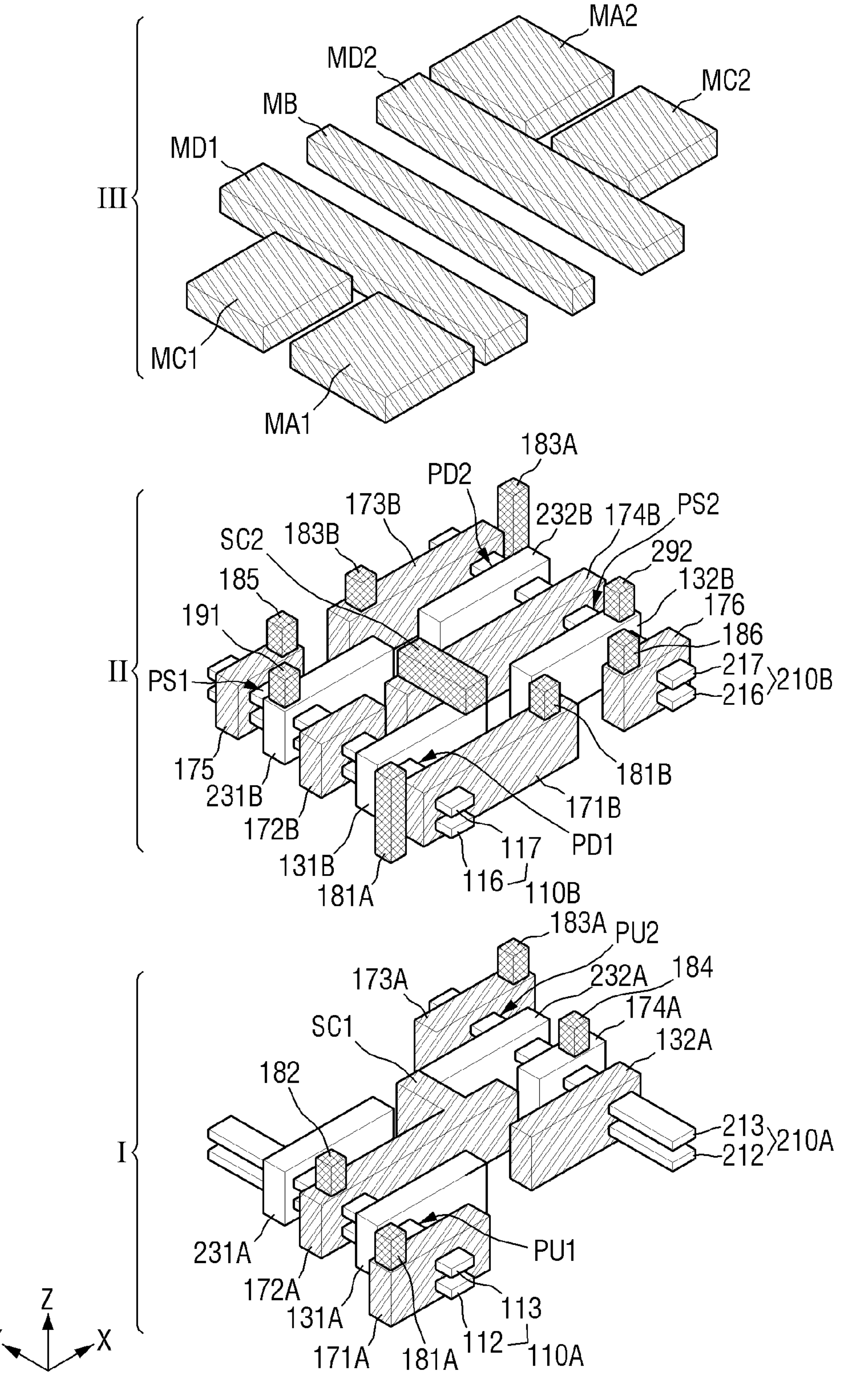
FIG. 6 is a schematic perspective view illustrating the semiconductor device of FIG. 2.

FIG. 1 is an example circuit view illustrating a semiconductor device according to some embodiments of the present disclosure. FIG. 2 is an example layout view illustrating a semiconductor device according to some embodiments of the present disclosure. FIG. 3 is a schematic cross-sectional view taken along line A-A of FIG. 2. FIG. 4 is a schematic cross-sectional view taken along line B-B of FIG. 2. FIG. 5 is a schematic cross-sectional view taken along line C-C of FIG. 2. FIG. 6 is a schematic perspective view illustrating the semiconductor device of FIG. 2.

Referring to FIG. 1, the semiconductor device according to some embodiments includes a pair of inverters INV1 and INV2 connected in parallel between a power node $V_{DD}$ and a ground node $V_{SS}$, and first and second pass transistors PS1 and PS2 that are respectively connected to output nodes of the inverters INV1 and INV2.

The first pass transistor PS1 may be connected to a bit line BL, and the second pass transistor PS2 may be connected to a complementary bit line/BL. A gate of the first pass transistor PS1 and a gate of the second pass transistor PS2 may be connected to a word line WL.

In order to configure one latch circuit, an input node of the first inverter INV1 may be connected to the output node of the second inverter INV2, and an input node of the second inverter INV2 may be connected to the output node of the first inverter INV1.

The first inverter INV1 may include a first pull-up transistor PU1 and a first pull-down transistor PD1, which are connected in series, and the second inverter INV2 may include a second pull-up transistor PU2 and a second pull-down transistor PD2, which are connected in series. The first pull-up transistor PU1 and the second pull-up transistor PU2 may be PFETs, and the first pull-down transistor PD1 and the second pull-down transistor PD2 may be NFETs.

Referring to FIGS. 1 to 6, the semiconductor device according to some embodiments may include a lower region I, an upper region II and a wiring region III.

The lower region I, the upper region II and the wiring region III may be sequentially stacked on a substrate 100. In the following description, the first pull-up transistor PU1 and the second pull-up transistor PU2 are part of the lower region I and the first pull-down transistor PD1 and the second pull-down transistor PD2 are part of the upper region II, but the disclosure is not limited thereto. It will be understood by those with ordinary skill in the art that the first pull-down transistor PD1 and the second pull-down transistor PD2 may be part of the lower region I and the first pull-up transistor PU1 and the second pull-up transistor PU2 may be part of the upper region II. Also, the following description will be based on the example embodiment in which the first pass transistor PS1 and the second pass transistor PS2 are part of the upper region II, but the disclosure is not limited thereto. It will be understood by those with ordinary skill in the art that the first pass transistor PS1 and the second pass transistor PS2 may be part of the lower region I.

The semiconductor device according to some embodiments may include a substrate 100, a field insulating layer 105, first active patterns 110A and 110B, second active patterns 210A and 210B, first gate structures 131A, 131B, 132A and 132B, second gate structures 231A, 231B, 232A and 232B, a cutting pattern CT, a gate dielectric layer 120, a gate spacer 140, a lower source/drain region 160A, an upper source/drain region 160B, lower source/drain contacts 171A to 174A, upper source/drain contacts 171B to 174B, 175 and 176, wiring patterns MA1, MA2, MB, MC1, MC2, MD1 and MD2, a lower shared contact SC1, and an upper shared contact SC2.

The substrate 100 may be a bulk silicon or silicon-on-insulator (SOI). In one variation, the substrate 100 may be a silicon substrate, or may include, for example, silicon germanium, silicon germanium on insulator (SGOI), indium antimonide, lead telluride, indium arsenide, indium phosphide, gallium arsenide or gallium antimonide. Alternatively, the substrate 100 may be an epitaxial layer formed on a base substrate. For convenience of description, the substrate 100 will be described as a silicon substrate.

The first active patterns 110A and 110B and the second active patterns 210A and 210B may be spaced apart from each other and extended in parallel in a first direction Y. For example, the first active patterns 110A and 110B and the second active patterns 210A and 210B may be extended to be long in the first direction Y, and may be spaced apart from each other in a second direction X intersecting the first direction Y. The first active patterns 110A and 110B and the second active patterns 210A and 210B may include lower active patterns 110A and 210A disposed in the lower region I and upper active patterns 110B and 210B disposed in the upper region II.

The first active patterns 110A and 110B may include the first lower active pattern 110A in the lower region I and the first upper active pattern 110B in the upper region II. For example, the substrate 100, the first lower active pattern 110A and the first upper active pattern 110B may be sequentially arranged along a third direction Z intersecting an upper surface of the substrate 100. The first lower active pattern 110A may be extended in the first direction Y on the substrate 100. The first upper active pattern 110B may be spaced apart from the first lower active pattern 110A, and may be extended in the first direction Y.

In some embodiments, the first lower active pattern 110A may include a plurality of bridge patterns (e.g., first and second bridge patterns 112 and 113) sequentially stacked on the substrate 100 and spaced apart from each other. In some embodiments, the first upper active pattern 110B may include a plurality of bridge patterns (e.g., third and fourth bridge patterns 116 and 117) sequentially stacked on the first lower active pattern 110A and spaced apart from each other. The first active patterns 110A and 110B may be used as channel regions of an MBCFET® that includes a multi-bridge channel. The number of bridge patterns included in the first active patterns 110A and 110B is only an example, and is not limited to the shown example.

In some embodiments, a first fin-type pattern 111 may be formed between the substrate 100 and the first bridge pattern 112. The first fin-type pattern 111 may be protruded from the upper surface of the substrate 100 and extended in the first direction Y. The first fin-type pattern 111 may be formed by etching a portion of the substrate 100, or may be an epitaxial layer grown from the substrate 100.

The second active patterns 210A and 210B may include a second lower active pattern 210A in the lower region I and a second upper active pattern 210B in the upper region II. For example, the substrate 100, the second lower active pattern 210A and the second upper active pattern 210B may be sequentially arranged along the third direction Z. The second lower active pattern 210A may be extended in the first direction Y on the substrate 100. The second upper active pattern 210B may be spaced apart from the second lower active pattern 210A and extended in the first direction Y.

In some embodiments, the second lower active pattern 210A may include a plurality of bridge patterns (e.g., fifth and sixth bridge patterns 212 and 213) sequentially stacked on the substrate 100 and spaced apart from each other. In some embodiments, the second upper active pattern 210B may include a plurality of bridge patterns (e.g., seventh and eighth bridge patterns 216 and 217) sequentially stacked on the second lower active pattern 210A and spaced apart from each other. The second active patterns 210A and 210B may be used as channel regions of the MBCFET® that includes a multi-bridge channel. The number of bridge patterns included in the second active patterns 210A and 210B is only an example and is not limited thereto.

In some embodiments, a second fin-type pattern 211 may be formed between the substrate 100 and the second lower active pattern 210A. The second fin-type pattern 211 may be protruded from the upper surface of the substrate 100 and extended in the first direction Y. The second fin-type pattern 211 may be formed by etching a portion of the substrate 100, or may be an epitaxial layer grown from the substrate 100.

Each of the first active patterns 110A and 110B and the second active patterns 210A and 210B may include silicon (Si) or germanium (Ge), which are elemental semiconductor materials. Alternatively, each of the first active patterns 110A and 110B and the second active patterns 210A and 210B may include a compound semiconductor, for example, a group IV-IV compound semiconductor or a group III-V compound semiconductor. The group IV-IV compound semiconductor may be a binary compound or ternary compound, which includes at least two of carbon (C), silicon (Si), germanium (Ge) or tin (Sn), or a compound including at least two of carbon (C), silicon (Si), germanium (Ge) or tin (Sn), which are doped with a group IV element. The group III-V compound semiconductor may be, for example, one of a binary compound, a ternary compound or a quaternary compound, which is formed by a combination of at least one of aluminum (Al), gallium (Ga) or indium (In), which is a group III element, and at least one of phosphorus (P), arsenic (As) or antimony (Sb), which is a group V element.

In some embodiments, isolation patterns 115 and 215 may be formed between the lower active patterns 110A and 210A and the upper active patterns 110B and 210B. For example, the lower active patterns 110A and 210A, the isolation patterns 115 and 215 and the upper active patterns 110B and 210B may be sequentially arranged along the third direction Z. The isolation patterns 115 and 215 may be spaced apart from the lower active patterns 110A and 210A, and the upper active patterns 110B and 210B may be spaced apart from the isolation patterns 115 and 215.

The isolation patterns 115 and 215 may include an insulating material, for example, at least one of silicon oxide, silicon nitride, silicon oxynitride, silicon oxycarbide, silicon boron nitride, silicon carbonitride, silicon oxycarbonitride, or a combination thereof, but is not limited thereto. In some other embodiments, the isolation patterns 115 and 215 may be omitted.

The field insulating layer 105 may be disposed on the substrate 100. In some embodiments, the field insulating layer 105 may cover or overlap at least a portion of sides of the first fin-type pattern 111 and at least a portion of sides of the second fin-type pattern 211. The field insulating layer 105 may include at least one of, for example, a silicon oxide layer, a silicon nitride layer, a silicon oxynitride layer or a combination thereof, but is not limited thereto.

The first gate structures 131A, 131B, 132A and 132B and the second gate structures 231A, 231B, 232A and 232B may be formed on the substrate 100 and the field insulation layer 105. The first gate structures 131A, 131B, 132A and 132B and the second gate structures 231A, 231B, 232A and 232B may be spaced apart from each other and extended in parallel in the second direction X. For example, the first gate structures 131A, 131B, 132A and 132B and the second gate structures 231A, 231B, 232A and 232B may be extended to be long in the second direction X, and may be spaced apart from each other in the first direction Y. In addition, the first gate structures 131A, 131B, 132A and 132B and the second gate structures 231A, 231B, 232A and 232B may include lower gate electrodes 131A, 132A, 231A and 232A disposed in the lower region I and upper gate electrodes 131B, 132B and 231B and 232B disposed in the upper region II.

The first gate structures 131A, 131B, 132A and 132B and the second gate structures 231A, 231B, 232A and 232B may overlap the first active patterns 110A and 110B and the second active patterns 210A and 210B. The first gate structures 131A, 131B, 132A and 132B and the second gate structure 231A, 231B, 232A and 232B may surround the periphery of the first active patterns 110A and 110B and the periphery of the second active patterns 210A and 210B. For example, the first active patterns 110A and 110B and the second active patterns 210A and 210B may be extended in the first direction Y to extend through the first gate structures 131A, 131B, 132A and 132B and the second gate structures 231A, 231B, 232A and 232B.

The cutting pattern CT may be formed on the substrate 100 and the field insulating layer 105. The cutting pattern CT may be extended to be long in the first direction Y between the first active patterns 110A and 110B and the second active patterns 210A and 210B to cut the first gate structures 131A, 131B, 132A and 132B and the second gate structures 231A, 231B, 232A and 232B.

For example, the first gate structures 131A, 131B, 132A and 132B may include first gate electrodes 131A and 131B and second gate electrodes 132A and 132B, which are separated from each other by the cutting pattern CT. The first gate electrodes 131A and 131B and the second gate electrodes 132A and 132B may be spaced apart from each other in the second direction X by the cutting pattern CT. The first gate electrodes 131A and 131B may be extended in the second direction X from one side of the cutting pattern CT to overlap the first active patterns 110A and 110B. The second gate electrodes 132A and 132B may be extended in the second direction X from the other side of the cutting pattern CT to overlap the second active patterns 210A and 210B.

Also, for example, the second gate structures 231A, 231B, 232A and 232B may include third gate electrodes 231A and 231B and fourth gate electrodes 232A and 232B, which are separated from each other by the cutting pattern CT. The third gate electrodes 231A and 231B and the fourth gate electrodes 232A and 232B may be spaced apart from each other in the second direction X by the cutting pattern CT. The third gate electrodes 231A to 231B may be extended in the second direction X from one side of the cutting pattern CT to overlap the first active patterns 110A and 110B. The fourth gate electrodes 232A and 232B may be extended in the second direction X from the other side of the cutting pattern CT to overlap the second active patterns 210A and 210B.

The cutting pattern CT may include an insulating material, for example, at least one of silicon oxide, silicon nitride, silicon oxynitride, silicon oxycarbide, silicon boron nitride, silicon carbonitride, silicon oxycarbonitride or a combination thereof, but is not limited thereto.

In some embodiments, the cutting pattern CT may define both ends of each of the gate electrodes 131A, 131B, 132A, 132B, 231A, 231B, 232A and 232B. In accordance with cutting of the cutting pattern CT, a length of the first gate electrodes 131A and 131B extended in the second direction X may be the same as that of the third gate electrodes 231A and 231B extended in the second direction X. In addition, a length of the second gate electrodes 132A and 132B extended in the second direction X may be the same as that of the fourth gate electrodes 232A and 232B extended in the second direction X. In the present disclosure, the term "same" includes not only completely identical but also minor differences that may occur due to a process margin or the like.

The first gate electrodes 131A and 131B may include a first lower gate electrode 131A in the lower region I and a first upper gate electrode 131B in the upper region II. The first lower gate electrode 131A may overlap the first lower active pattern 110A. The first upper gate electrode 131B may overlap the first upper active pattern 110B on the first lower gate electrode 131A. The first upper gate electrode 131B may be in contact with the first lower gate electrode 131A. That is, the first lower gate electrode 131A and the first upper gate electrode 131B may be electrically connected to each other.

The first gate electrodes 131A and 131B may be provided as gate electrodes of the first inverter INV1. For example, the first lower active pattern 110A overlapping the first lower gate electrode 131A may be provided as a channel region of the first pull-up transistor PU1, and the first upper active pattern 110B overlapping the first upper gate electrode 131B may be provided as a channel region of the first pull-down transistor PD1.

The second gate electrodes 132A and 132B may include a second lower gate electrode 132A in the lower region I and a second upper gate electrode 132B in the upper region II. The second lower gate electrode 132A may cross the second lower active pattern 210A. The second upper gate electrode 132B may cross the second upper active pattern 210B on the second lower gate electrode 132A. The second upper gate electrode 132B may be in contact with the second lower gate electrode 132A. That is, the second lower gate electrode 132A and the second upper gate electrode 132B may be electrically connected to each other.

In some embodiments, the second gate electrodes 132A and 132B may overlap at least one of the second lower active pattern 210A and the second upper active pattern 210B. For example, in one variation, one of the second lower gate electrode 132A and the second upper gate electrode 132B may be omitted.

The second gate electrodes 132A and 132B may be provided as gate electrodes of the second pass transistor PS2. For example, the second upper active pattern 210B overlapping the second upper gate electrode 132B may be provided as a channel region of the second pass transistor PS2. In this case, as shown, the second pass transistor PS2 may be provided as an NFET in the upper region II. For another example, the second lower active pattern 210A overlapping the second lower gate electrode 132A may be provided as the channel region of the second pass transistor PS2. In this case, the second pass transistor PS2 may be provided as a PFET in the lower region I unlike the shown example.

The third gate electrodes 231A and 231B may include a third lower gate electrode 231A in the lower region I and a third upper gate electrode 231B in the upper region II. The third lower gate electrode 231A may overlap the first lower active pattern 110A. The third upper gate electrode 231B may overlap the first upper active pattern 110B on the third lower gate electrode 231A. The third upper gate electrode 231B may be in contact with the third lower gate electrode 231A. That is, the third lower gate electrode 231A and the third upper gate electrode 231B may be electrically connected to each other.

In some embodiments, the third gate electrodes 231A and 231B may overlap at least one of the first lower active pattern 110A or the first upper active pattern 110B. For example, in one variation, one of the third lower gate electrode 231A and the third upper gate electrode 231B may be omitted.

The third gate electrodes 231A and 231B may be provided as a gate electrode of the first pass transistor PS1. For example, the first upper active pattern 110B overlapping the third upper gate electrode 231B may be provided as a channel region of the first pass transistor PS1. In this case, as shown, the first pass transistor PS1 may be provided as an NFET in the upper region II. For another example, the first lower active pattern 110A overlapping the third lower gate electrode 231A may be provided as the channel region of the first pass transistor PS1. In this case, the first pass transistor PS1 may be provided as a PFET in the lower region I, unlike the shown example.

The fourth gate electrodes 232A and 232B may include a fourth lower gate electrode 232A in the lower region I and a fourth upper gate electrode 232B in the upper region II. The fourth lower gate electrode 232A may cross the second lower active pattern 210A. The fourth upper gate electrode 232B may cross the second upper active pattern 210B on the fourth lower gate electrode 232A. The fourth upper gate electrode 232B may be in contact with the fourth lower gate electrode 232A. That is, the fourth lower gate electrode 232A and the fourth upper gate electrode 232B may be electrically connected to each other.

The fourth gate electrodes 232A and 232B may be provided as gate electrodes of the second inverter INV2. For example, the second lower active pattern 210A overlapping the fourth lower gate electrode 232A may be provided as a channel region of the second pull-up transistor PU2, and the second upper active pattern 210B overlapping the fourth upper gate electrode 232B may be provided as a channel region of the second pull-down transistor PD2.

Each of the gate electrodes 131A, 131B, 132A, 132B, 231A, 231B, 232A and 232B may include a conductive material, for example, at least one of TiN, WN, TaN, Ru, TiC, TaC, Ti, Ag, Al, TiAl, TiAlN, TiAlC, TaCN, TaSiN, Mn, Zr, W, Al or a combination thereof, but is not limited thereto. Each of the gate electrodes 131A, 131B, 132A, 132B, 231A, 231B, 232A and 232B may be formed by a replacement process, but is not limited thereto.

Each of the gate electrodes 131A, 131B, 132A, 132B, 231A, 231B, 232A and 232B is shown as only a single layer, but this is only an example. Each of the gate electrodes 131A, 131B, 132A, 132B, 231A, 231B, 232A and 232B may be formed by stacking a plurality of conductive layers. For example, each of the gate electrodes 131A, 131B, 132A, 132B, 231A, 231B, 232A and 232B may include a work function adjustment layer for adjusting a work function and a filling conductive layer for filling a space formed by the work function adjustment layer. The work function adjustment layer may include at least one of, for example, TiN, TaN, TiC, TaC, TiAlC or a combination thereof. The filling conductive layer may include, for example, W or Al.

In some embodiments, the lower gate electrodes 131A, 132A, 231A and 232A and the upper gate electrodes 131B, 132B, 231B and 232B may include different conductive materials. For example, the lower gate electrodes 131A, 132A, 231A and 232A and the upper gate electrodes 131B, 132B, 231B and 232B may include work function adjustment layers of different conductivity types. For example, the lower gate electrodes 131A, 132A, 231A and 232A may include a p-type work function adjustment layer, and the upper gate electrodes 131B, 132B, 231B and 232B may include an n-type work function adjustment layer. In some other embodiments, the lower gate electrodes 131A, 132A, 231A and 232A and the upper gate electrodes 131B, 132B, 231B and 232B may include the same conductive material.

The gate dielectric layer 120 may be interposed between the active patterns 110A, 110B, 210A and 210B and the gate electrodes 131A, 131B, 132A, 132B, 231A, 231B, 232A and 232B. The gate dielectric layer 120 may include a dielectric material, for example, at least one of silicon oxide, silicon oxynitride, silicon nitride or a high dielectric constant material having a dielectric constant greater than that of silicon oxide. The high dielectric constant material may include at least one of hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, lead zinc niobate, or a combination thereof, but is not limited thereto.

The gate dielectric layer 120 is shown as being only cut by the cutting pattern CT, but this is only an example. As another example, the gate dielectric layer 120 may be further extended along sides of the cutting pattern CT.

The gate spacer 140 may be extended along sides of each of the gate electrodes 131A, 131B, 132A, 132B, 231A, 231B, 232A and 232B. Each of the active patterns 110A, 110B, 210A and 210B may be extended in the first direction Y and through the gate spacer 140. The gate spacer 140 may include an insulating material, for example, at least one of silicon oxide, silicon nitride, silicon oxynitride, silicon oxycarbide, silicon boron nitride, silicon carbonitride, silicon oxycarbonitride or a combination thereof, but is not limited thereto.

In some embodiments, the gate dielectric layer 120 may include an interfacial layer 122 and a high dielectric layer 124, which are sequentially stacked on the respective active patterns 110A, 110B, 210A and 210B.

The interfacial layer 122 may at least partially surround the periphery of each of the bridge patterns 112, 113, 116, 117, 212, 213, 216 and 217. For example, the interfacial layer 122 may be extended to be conformal along the periphery of each of the bridge patterns 112, 113, 116, 117, 212, 213, 216 and 217. Further, the interfacial layer 122 may be extended along the fin-type patterns 111 and 211 exposed from the field insulating layer 105.

In some embodiments, the interfacial layer 122 may be an oxide layer formed by oxidizing surfaces of the active patterns 110A, 110B, 210A and 210B. For example, when the active patterns 110A, 110B, 210A and 210B include silicon (Si), the interfacial layer 122 may include a silicon oxide layer.

The high dielectric layer 124 may at least partially surround the periphery of the interfacial layer 122. A portion of the high dielectric layer 124 may be interposed between the gate electrodes 131A, 131B, 132A, 132B, 231A, 231B, 232A and 232B and the gate spacer 140. For example, the high dielectric layer 124 may be extended to be conformal along the periphery of the interfacial layer 122 and a profile of an inner side of the gate spacer 140. The high dielectric layer 124 may be further extended along an upper surface of the field insulating layer 105.

In some embodiments, the high dielectric layer 124 may include a high dielectric constant material having a dielectric constant greater than that of silicon oxide. The high dielectric constant material may include at least one of, for example, hafnium oxide ($HfO_2$), zirconium oxide ($ZrO_2$), lanthanum oxide ($La_2O_3$), aluminum oxide ($Al_2O_3$), titanium oxide ($TiO_2$), strontium titanium oxide ($SrTiO_3$), lanthanum aluminum oxide ($LaAlO_3$), yttrium oxide ($Y_2O_3$), hafnium oxynitride ($HfO_xN_y$), zirconium oxynitride ($ZrO_xN_y$), lanthanum oxynitride ($La_2O_xN_y$), aluminum oxynitride ($Al_2O_xN_y$), titanium oxynitride ($TiO_xN_y$), strontium titanium oxynitride ($SrTiO_xN_y$), lanthanum aluminum oxynitride ($LaAlO_xN_y$), yttrium oxynitride ($Y_2O_xN_y$) or ta combination thereof, but is not limited thereto.

The lower source/drain region 160A may be formed on at least one side of each of the lower gate electrodes 131A, 132A, 231A and 232A. The lower active patterns 110A and 210A may be connected to the lower source/drain regions 160A by extending through the lower gate electrodes 131A, 132A, 231A and 232A and the gate spacer 140. The lower source/drain region 160A may be electrically insulated from the lower gate electrodes 131A, 132A, 231A and 232A by the gate spacer 140.

In some embodiments, the lower source/drain region 160A may include an epitaxial layer. For example, the lower source/drain region 160A may be an epitaxial layer grown from the lower active patterns 110A and 210A by an epitaxial growth method.

The upper source/drain region 160A may be formed on at least one side of each of the upper gate electrodes 131B, 132B, 231B and 232B. The upper active patterns 110B and 210B may be connected to the upper source/drain region 160B by extending through the upper gate electrodes 131B, 132B, 231B and 232B and the gate spacer 140. The upper source/drain region 160B may be electrically insulated from the upper gate electrodes 131B, 132B, 231B and 232B by the gate spacer 140.

In some embodiments, the upper source/drain regions 160B may include an epitaxial layer. For example, the upper source/drain region 160B may be an epitaxial layer grown by an epitaxial growth method from the upper active patterns 110B and 210B.

The lower source/drain region 160A may have a first conductivity type, and the upper source/drain region 160B may have a second conductivity type different from the first conductivity type. For example, the first conductivity type may be p-type, and the second conductivity type may be n-type. In this case, the lower active patterns 110A and 210A may be used as the channel regions of the PFET, and the upper active patterns 110B and 210B may be used as the channel regions of the NFET, but this is only an example. The first conductivity type may be p-type, and the second conductivity type may be n-type.

The lower source/drain contacts 171A to 174A may be disposed in the lower region I. The lower source/drain contacts 171A to 174A may be connected to the lower source/drain region 160A.

For example, the first lower source/drain contact 171A connected to the lower source/drain region 160A of the first lower active pattern 110A may be formed on one side of the first lower gate electrode 131A opposite to the third lower gate electrode 231A. For example, the second lower source/drain contact 172A connected to the lower source/drain region 160A of the first lower active pattern 110A may be formed between the first lower gate electrode 131A and the third lower gate electrode 231A. For example, the third lower source/drain contact 173A connected to the lower source/drain region 160A of the second lower active pattern 210A may be formed on one side of the fourth lower gate electrode 232A opposite to the second lower gate electrode 132A. For example, the fourth lower source/drain contact 174A connected to the lower source/drain region 160A of the second lower active pattern 210A may be formed between the second lower gate electrode 132A and the fourth lower gate electrode 232A. The shape and arrangement of the lower source/drain contacts 171A to 174A are only examples and are not limited to the shown examples.

In some embodiments, a length of the second lower source/drain contact 172A extended in the second direction X may be greater than that of the fourth lower source/drain contact 174A extended in the second direction X. In some embodiments, a portion of the second lower source/drain contact 172A may overlap a portion of the fourth lower gate electrode 232A in the first direction Y.

The upper source/drain contacts 171B to 174B, 175 and 176 may be disposed in the upper region II. The upper source/drain contacts 171B to 174B, 175 and 176 may be connected to the upper source/drain region 160B.

For example, the first upper source/drain contact 171B connected to the upper source/drain region 160B of the first upper active pattern 110B may be formed on one side of the first upper gate electrode 131B opposite to the third upper gate electrode 231B. For example, the second upper source/drain contact 172B connected to the upper source/drain region 160B of the first upper active pattern 110B may be formed between the first upper gate electrode 131B and the third upper gate electrode 231B. For example, the third upper source/drain contact 173B connected to the upper source/drain region 160B of the second upper active pattern 210B may be formed on one side of the fourth upper gate electrode 232B opposite to the second upper gate electrode 132B. For example, the fourth upper source/drain contact 174B connected to the upper source/drain region 160B of the second upper active pattern 210B may be formed between the second upper gate electrode 132B and the fourth upper gate electrode 232B. For example, the fifth upper source/drain contact 175 connected to the upper source/drain region 160B of the first upper active pattern 110B may be formed on one side of the third upper gate electrode 231B opposite to the first upper gate electrode 131B. For example, the sixth upper source/drain contact 176 connected to the upper source/drain region 160B of the second upper active pattern 210B may be formed on one side of the second upper gate electrode 132B opposite to the fourth upper gate electrode 232B. The shape and arrangement of the upper source/drain contacts 171B to 174B, 175 and 176 are only examples and are not limited thereto.

In some embodiments, a length of the fourth upper source/drain contact 174B extended in the second direction X may be greater than that of the second upper source/drain contact 172B extended in the second direction X. In some embodiments, a portion of the fourth upper source/drain contact 174B may overlap a portion of the first upper gate electrode 131B in the first direction Y. In some embodiments, a portion of the fourth upper source/drain contact 174B may overlap a portion of the second lower source/drain contact 172A in the third direction Z.

The wiring patterns MA1, MA2, MB, MC1, MC2, MD1 and MD2 may be disposed in the wiring region III. For example, an inter-wiring insulating layer 330 may be stacked on an interlayer insulating layer 320. The wiring patterns MA1, MA2, MB, MC1, MC2, MD1 and MD2 may be formed in the inter-wiring insulating layer 330 and insulated from one another.

A first signal having a first power/voltage may be provided to the first lower source/drain contact 171A. For example, a first lower contact via 181A connected to an upper surface of the first lower source/drain contact 171A may be formed. The first wiring pattern MA1 connected to the first lower contact via 181A may be formed in the wiring region III. The first wiring pattern MA1 may be provided as the power node $V_{DD}$ to provide the first signal to the first lower source/drain contact 171A. In some embodiments, the first lower contact via 181A may be extended in the third direction Z over the lower region I and the upper region II.

The second lower source/drain contact 172A and the second upper source/drain contact 172B may be connected to each other. For example, a second lower contact via 182 connecting an upper surface of the second lower source/drain contact 172A with a lower surface of the second upper source/drain contact 172B may be formed. The second lower source/drain contact 172A and the second upper source/drain contact 172B may be provided as the output nodes of the first inverter INV1.

The first signal may be provided to the third lower source/drain contact 173A. For example, a third lower contact via 183A connected to an upper surface of the third lower source/drain contact 173A may be formed. The second wiring pattern MA2 connected to the third lower contact via 183A may be formed in the wiring region III. The second wiring pattern MA2 may be provided as the power node $V_{DD}$ to provide the first signal to the third lower source/drain contact 173A. In some embodiments, the third lower contact via 183A may be extended in the third direction Z over the lower region I and the upper region II.

The fourth lower source/drain contact 174A and the fourth upper source/drain contact 174B may be connected to each other. For example, a fourth lower contact via 184 connecting an upper surface of the fourth lower source/drain contact 174A with a lower surface of the fourth upper source/drain contact 174B may be formed. The fourth lower source/drain contact 174A and the fourth upper source/drain contact 174B may be provided as the output nodes of the second inverter INV2.

The lower contact vias 181A, 182, 183A and 184 may be connected to the lower source/drain contacts 171A to 174A by extending through an isolation insulating layer 310, for example. The isolation insulating layer 310 may cover or overlap the lower source/drain region 160A. The isolation insulating layer 310 may be interposed between the lower source/drain region 160A and the upper source/drain region 160B. The upper source/drain region 160B may be electrically insulated from the lower source/drain region 160A by the isolation insulating layer 310. The isolation insulating layer 310 may include at least one of, for example, silicon oxide, silicon nitride, silicon oxynitride, silicon oxycarbide, silicon boron nitride, silicon carbonitride, silicon oxycarbonitride or a combination thereof, but is not limited thereto.

A second signal having a different power/voltage than the first signal may be provided to the first upper source/drain contact 171B and the third upper source/drain contact 173B. For example, a first upper contact via 181B connected to an upper surface of the first upper source/drain contact 171B may be formed, and a second upper contact via 183B connected to an upper surface of the third upper source/drain contact 173B may be formed. In addition, the third wiring pattern MB connected to the first upper contact via 181B and the second upper contact via 183B may be formed in the wiring region III. The third wiring pattern MB may be provided as the ground node $V_{SS}$ to provide the second signal to the first upper source/drain contact 171B and the third upper source/drain contact 173B.

In some embodiments, the first upper contact via 181B and the second upper contact via 183B may be arranged along the first direction Y. The third wiring pattern MB may be extended to be long in the first direction Y to connect the first upper contact via 181B with the second upper contact via 183B.

The third gate electrodes 231A and 231B may be connected to the word line WL. For example, a first gate contact 191 connected to an upper surface of the third upper gate electrode 231B may be formed. The fourth wiring pattern MC1 connected to the first gate contact 191 may be formed in the wiring region III. The fourth wiring pattern MC1 may be provided as a node of the word line WL, and thus may be connected to the gate (that is, the third gate electrodes 231A and 231B) of the first pass transistor PS1.

The second gate electrodes 132A to 132B may be connected to the word line WL. For example, a second gate contact 292 connected to an upper surface of the second upper gate electrode 132B may be formed. The fifth wiring pattern MC2 connected to the second gate contact 292 may be formed in the wiring region III. The fifth wiring pattern MC2 may be provided as the node of the word line WL, and thus may be connected to the gate (that is, the second gate electrodes 132A and 132B) of the second pass transistor PS2.

In some embodiments, at least a portion of the fourth wiring pattern MC1 and at least a portion of the fifth wiring pattern MC2 may overlap each other in the second direction X.

The fifth upper source/drain contact 175 may be connected to the bit line BL. For example, a third upper contact via 185 connected to an upper surface of the fifth upper source/drain contact 175 may be formed. The sixth wiring pattern MD1 connected to the third upper contact via 185 may be formed in the wiring region III. The sixth wiring pattern MD1 may be provided as the bit line BL, and thus may be connected to the first pass transistor PS1 through the fifth upper source/drain contact 175. In some embodiments, the sixth wiring pattern MD1 may be extended to be long in the first direction Y.

The sixth upper source/drain contact 176 may be connected to the complementary bit line/BL. For example, a fourth upper contact via 186 connected to an upper surface of the sixth upper source/drain contact 176 may be formed. The seventh wiring pattern MD2 connected to the fourth upper contact via 186 may be formed in the wiring region III. The seventh wiring pattern MD2 may be provided as the complementary bit line/BL, and thus may be connected to the second pass transistor PS2 through the sixth upper source/drain contact 176. In some embodiments, the seventh wiring pattern MD2 may be extended to be long in the first direction Y.

The upper contact vias 181B, 183B, 185 and 186 may be connected to the upper source/drain contacts 171B to 174B, 175 and 176 by extending through the interlayer insulating layer 320. The interlayer insulating layer 320 may cover or overlap the upper source/drain region 160B. The interlayer insulating layer 320 may include at least one of, for example, silicon oxide, silicon nitride, silicon oxynitride, silicon oxycarbide, silicon boron nitride, silicon carbonitride, silicon oxycarbonitride or a combination thereof, but is not limited thereto. In addition, the first gate contact 191 may be connected to the third gate electrodes 231A and 231B by extending through the interlayer insulating layer 320, and the second gate contact 292 may be connected to the second gate electrodes 132A and 132B through the interlayer insulating layer 320.

The lower shared contact SC1 may be disposed in the lower region I. The lower shared contact SC1 may connect the second lower source/drain contact 172A with the fourth gate electrodes 232A and 232B. The output node (that is, the second lower source/drain contact 172A) of the first inverter INV1 may be connected to the input node (that is, the fourth gate electrodes 232A and 232B) of the second inverter INV2 through the lower shared contact SC1.

The lower shared contact SC1 may be spaced apart from the upper source/drain contacts 171B to 174B, 175 and 176 in the third direction Z. For example, an upper surface of the lower shared contact SC1 may be formed at a lower level than the lower surface of the fourth upper source/drain contact 174B based on the upper surface of the substrate 100. Therefore, the lower shared contact SC1 may be electrically insulated from the fourth upper source/drain contact 174B.

In some embodiments, the lower shared contact SC1 may be extended in the first direction Y to connect the second lower source/drain contact 172A with the fourth lower gate electrode 232A. For example, the lower shared contact SC1 may be extended in the first direction Y from a region where the second lower source/drain contact 172A and the fourth lower gate electrode 232A overlap each other in the first direction Y.

In some embodiments, the lower shared contact SC1 may be formed on a side of the second lower source/drain contact 172A and a side of the fourth lower gate electrode 232A. For example, the lower shared contact SC1 may be protruded from a side of the second lower source/drain contact 172A in the first direction Y and thus connected to a side of the fourth lower gate electrode 232A. In some embodiments, the lower shared contact SC1 may be formed at the same level as the lower source/drain contacts 171A to 174A. In the present disclosure, the term "same level" means "being formed by the same fabricating process."

In some embodiments, at least a portion of the lower shared contact SC1 may overlap the cutting pattern CT in the third direction Z. The lower shared contact SC1 may be connected to a side of a fourth lower gate electrode 232A, which extends in the second direction X, but the technical spirits of the present disclosure are not limited thereto. The lower shared contact SC1 may be connected to a side of the fourth lower gate electrode 232A, which extends in the first direction Y.

The upper shared contact SC2 may be disposed in the upper region II. The upper shared contact SC2 may connect the fourth upper source/drain contact 174B with the first gate electrodes 131A and 131B. The output node (that is, the fourth upper source/drain contact 174B) of the second inverter INV2 may be connected to the input node (that is, the first gate electrodes 131A and 131B) of the first inverter INV1 through the upper shared contact SC2.

The upper shared contact SC2 may be spaced apart from the lower source/drain contacts 171A to 174A in the third direction Z. For example, a lower surface of the upper shared contact SC2 may be formed at a higher level than the upper surface of the second lower source/drain contact 172A based on the upper surface of the substrate 100. Therefore, the upper shared contact SC2 may be electrically insulated from the second lower source/drain contact 172A.

In addition, the upper shared contact SC2 may be spaced apart from the wiring patterns MA1, MA2, MB, MC1, MC2, MD1 and MD2 in the third direction Z. For example, an upper surface of the upper shared contact SC2 may be formed at a lower level than lower surfaces of the wiring patterns MA1, MA2, MB, MC1, MC2, MD1 and MD2 based on the upper surface of the substrate 100. Therefore, the upper shared contact SC2 may be electrically insulated from the wiring patterns MA1, MA2, MB, MC1, MC2, MD1 and MD2.

In some embodiments, the upper shared contact SC2 may be extended in the first direction Y to connect the fourth upper source/drain contact 174B with the first upper gate electrode 131B. For example, the upper shared contact SC2 may be extended in the first direction Y from a region where the fourth upper source/drain contact 174B and the first upper gate electrode 131B overlap each other in the first direction Y.

In some embodiments, the upper shared contact SC2 may be formed on an upper surface of the fourth upper source/drain contact 174B and an upper surface of the first upper gate electrode 131B. For example, the upper shared contact SC2 may be extended in the first direction Y and thus connected to the upper surface of the fourth upper source/drain contact 174B and the upper surface of the first upper gate electrode 131B. In some embodiments, the upper shared contact SC2 may be formed at the same level as the upper contact vias 181B, 183B, 185 and 186 and/or the gate contacts 191 and 292.

In some embodiments, the upper shared contact SC2 may not overlap the cutting pattern CT in the third direction Z, but the technical spirits of the present disclosure are not limited thereto. At least a portion of the upper shared contact SC2 may be formed on an upper surface of the cutting pattern CT.

As a semiconductor device is increasingly integrated, individual circuit patterns are becoming more miniaturized to implement more semiconductor devices in the same area. To this end, a semiconductor device based on a stacked multi-gate transistor in which a multi-gate transistor of an upper region II is stacked on a multi-gate transistor of a lower region I is being studied. However, the semiconductor device has a problem in that it is difficult to improve the degree of integration due to complexity of the circuit patterns.

For example, in order to configure a latch circuit of an SRAM, shared contacts for forming nodes of the latch circuit may be provided in the upper region II. However, the shared contacts may be in the form of a diagonal or curved shape depending on the arrangement of the gate electrodes and the arrangement of the source/drain contacts to configure the latch circuit. This leads to a severity of the complexity of the circuit patterns. In order to solve this problem, wiring patterns for forming nodes of the latch circuit may be provided in the wiring region III on the upper region II. However, this also leads to severity of the complexity of the wiring patterns, whereby voltage drop (IR drop) and parasitic capacitance may be increased.

Unlike the above example, the semiconductor device according to some embodiments may reduce the complexity of the circuit patterns and/or the complexity of the wiring patterns by using the lower shared contact SC1 of the lower region I and the upper shared contact SC2 of the upper region II. In detail, and as described above, the lower shared contact SC1 may connect the output node (that is, the second lower source/drain contact 172A) of the first inverter INV1 with the input node (that is, the fourth gate electrodes 232A and 232B) of the second inverter INV2 in the lower region I. In addition, the upper shared contact SC2 may connect the output node (that is, the fourth upper source/drain contact 174B) of the second inverter INV2 with the input node (that is, the first gate electrodes 131A and 131B) of the first inverter INV1 in the upper region II. That is, as the shared contacts are disposed to be distributed in the lower region I and the upper region II, and as such, a semiconductor device having improved degree of freedom in design and integration may be provided.

In the semiconductor device according to some embodiments, the first gate structures 131A, 131B, 132A and 132B and the second gate structures 231A, 231B, 232A and 232B may be all cut by the same cutting pattern CT that is extended in a straight direction. In detail, as described above, the cutting pattern CT may be extended to be long in the first direction Y to separate the first gate electrodes 131A and 131B from the second gate electrodes 132A and 132B and separate the third gate electrodes 231A and 231B from the fourth gate electrodes 232A and 232B. Therefore, the difficulty in a process for forming the gate electrodes 131A, 131B, 132A, 132B, 231A, 231B, 232A and 232B may be reduced, and a semiconductor device having more improved degree of integration may be provided.

Figure 7:
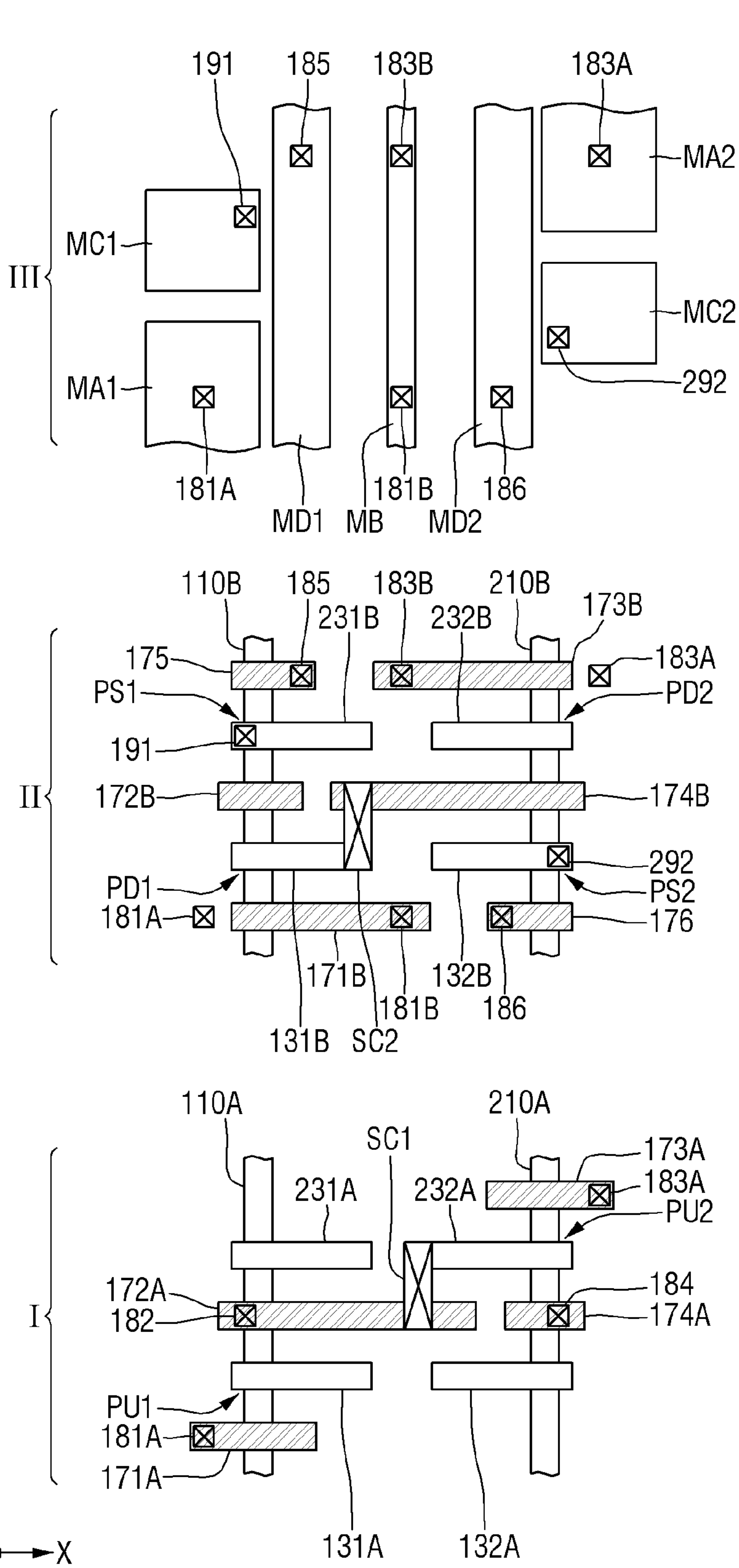
FIG. 7 is an example layout view illustrating a semiconductor device according to some embodiments of the present disclosure.
Figure 8:
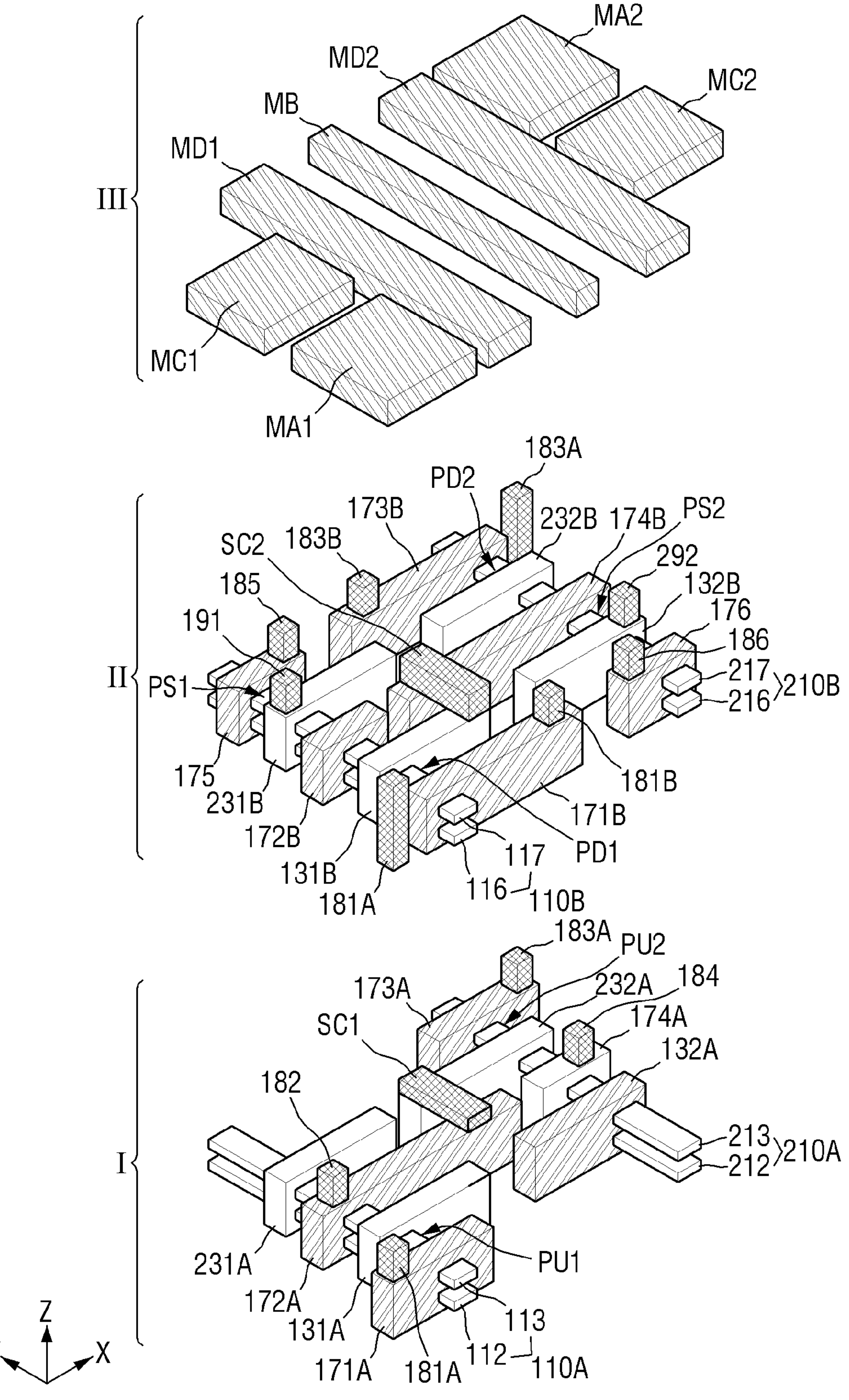
FIG. 8 is a schematic perspective view illustrating a semiconductor device of FIG. 7.

FIG. 7 is an example layout view illustrating a semiconductor device according to some embodiments of the present disclosure. FIG. 8 is a schematic perspective view illustrating a semiconductor device of FIG. 7. For convenience of description, redundant portions of those described above with reference to FIGS. 1 to 6 will be briefly described or omitted.

Referring to FIGS. 7 and 8, in the semiconductor device according to some embodiments, the lower shared contact SC1 may be formed on the upper surface of the second lower source/drain contact 172A and an upper surface of the fourth lower gate electrode 232A.

For example, the lower shared contact SC1 may be extended in the first direction Y and thus connected to the upper surface of the second lower source/drain contact 172A and the upper surface of the fourth lower gate electrode 232A.

The lower shared contact SC1 may be spaced apart from the upper source/drain contacts 171B to 174B, 175 and 176 in the third direction Z. For example, the upper surface of the lower shared contact SC1 may be formed at a lower level than an upper surface of the second lower contact via 182 and an upper surface of the fourth lower contact via 184 based on the upper surface of the substrate 100.

Figure 9:
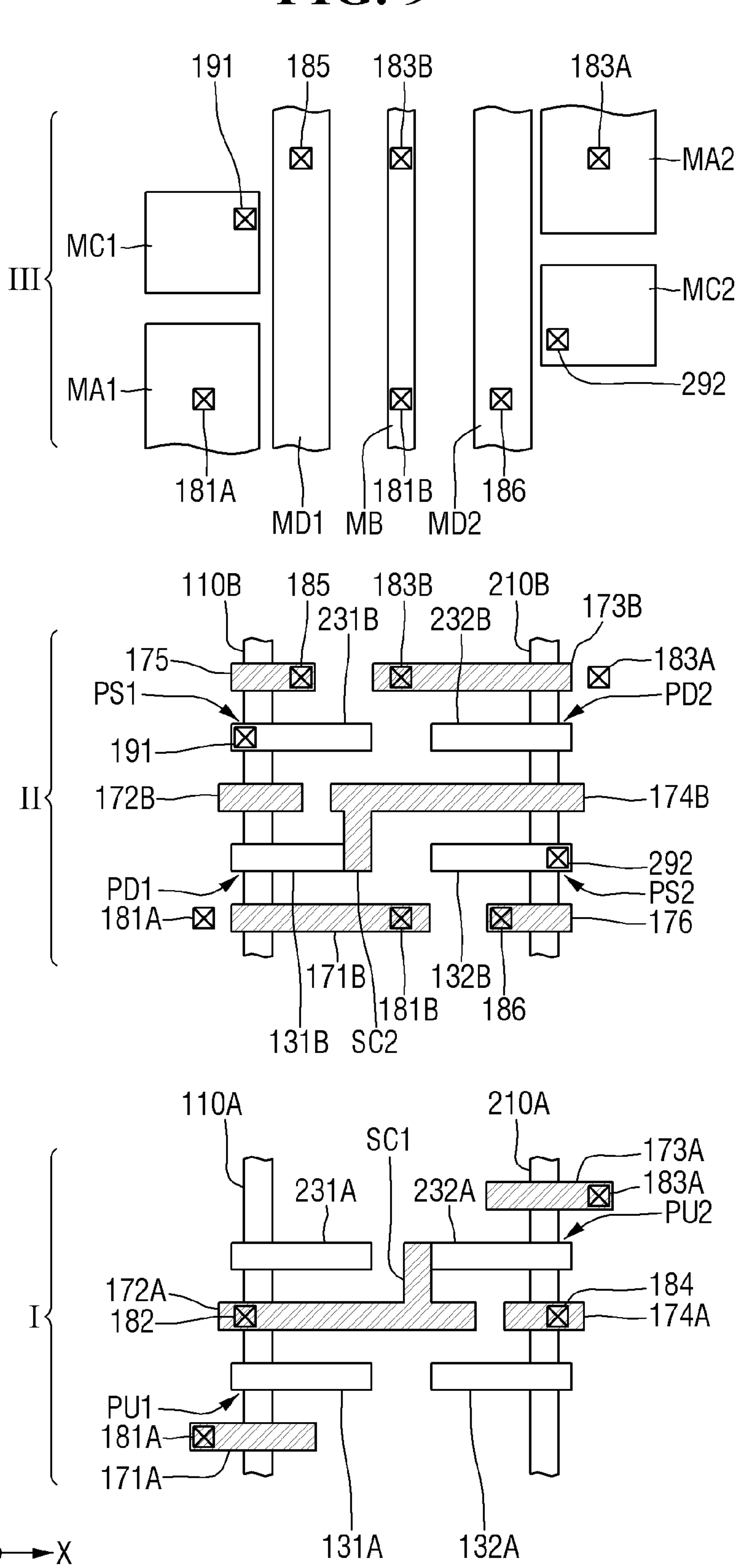
FIG. 9 is an example layout view illustrating a semiconductor device according to some embodiments of the present disclosure.
Figure 10:
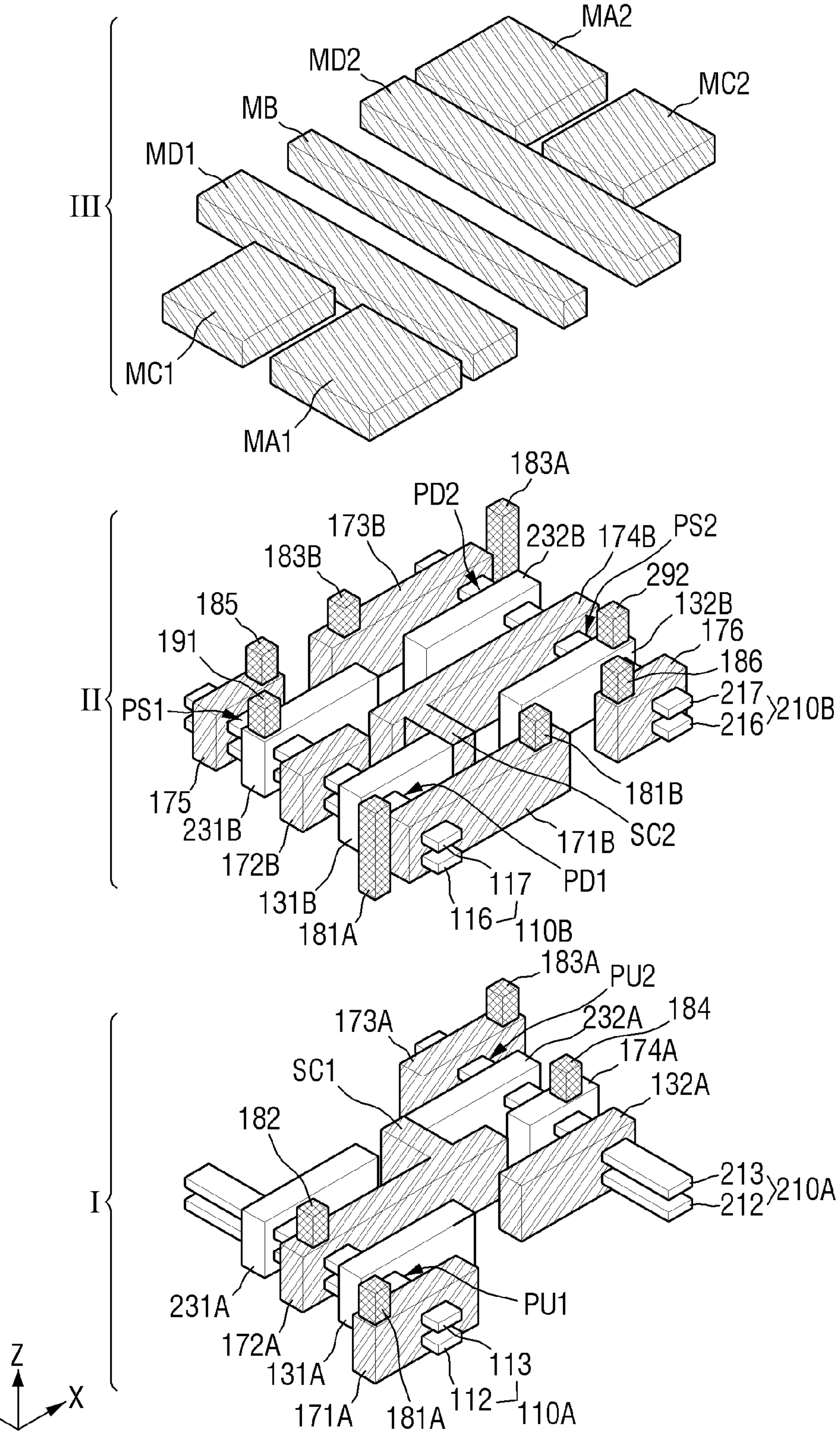
FIG. 10 is a schematic perspective view illustrating the semiconductor device of FIG. 9.

FIG. 9 is an example layout view illustrating a semiconductor device according to some embodiments of the present disclosure. FIG. 10 is a schematic perspective view illustrating the semiconductor device of FIG. 9. For convenience of description, redundant portions of those described above with reference to FIGS. 1 to 6 will be briefly described or omitted.

Referring to FIGS. 9 and 10, in the semiconductor device according to some embodiments, the upper shared contact SC2 may be formed on a side of a fourth upper source/drain contact 174B and a side of the first upper gate electrode 131B.

For example, the upper shared contact SC2 may be protruded from the side of the fourth upper source/drain contact 174B in the first direction Y and thus connected to the side of the first upper gate electrode 131B. In some embodiments, the upper shared contact SC2 may be formed at the same level as the upper source/drain contacts 171B to 174B, 175 and 176.

The upper shared contact SC2 may be spaced apart from the lower source/drain contacts 171A to 174A in the third direction Z. For example, the lower surface of the upper shared contact SC2 may be formed at a higher level than the upper surface of the second lower source/drain contact 172A based on the upper surface of the substrate 100.

Figure 11:
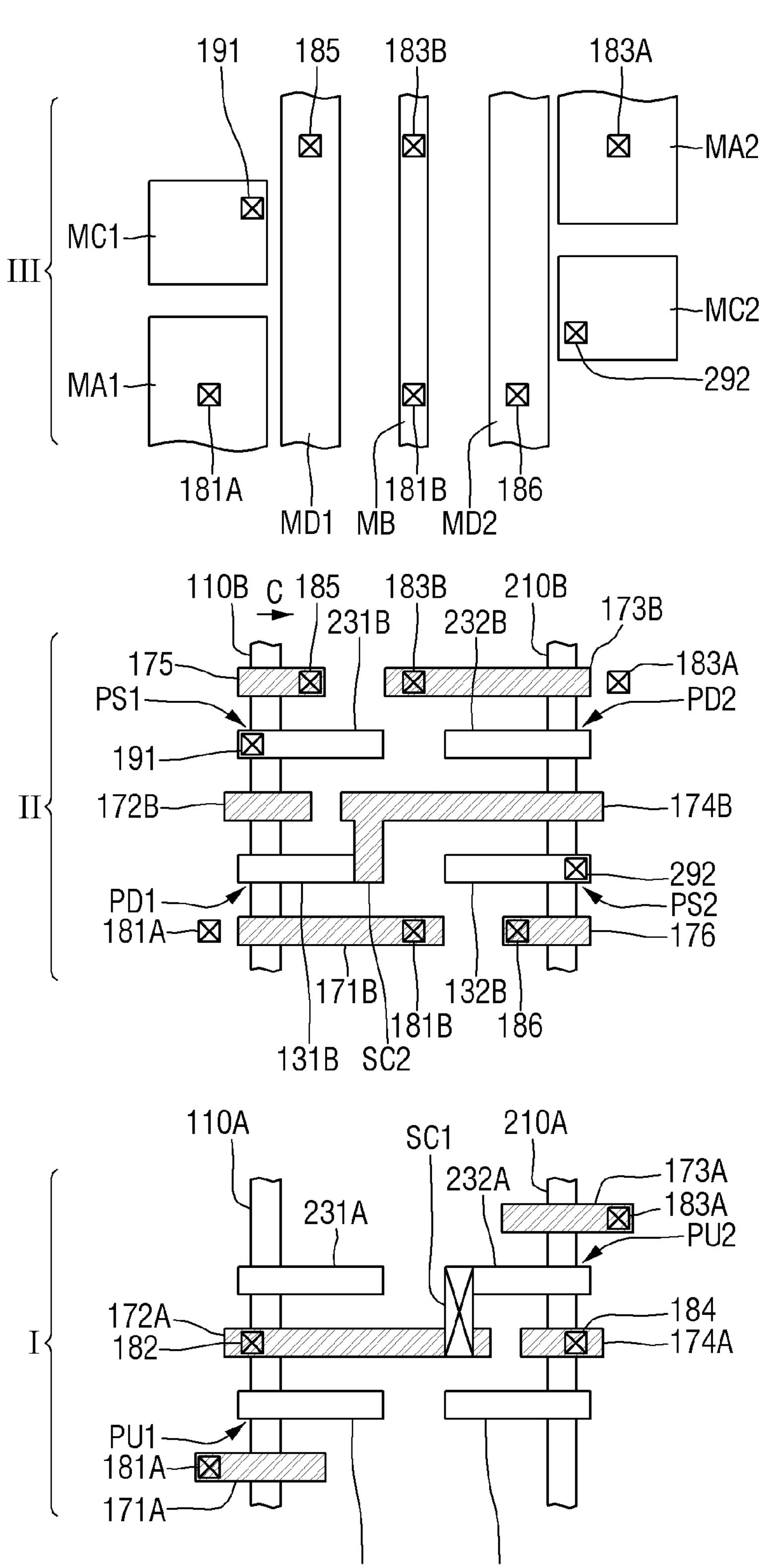
FIG. 11 is an example layout view illustrating a semiconductor device according to some embodiments of the present disclosure.
Figure 12:
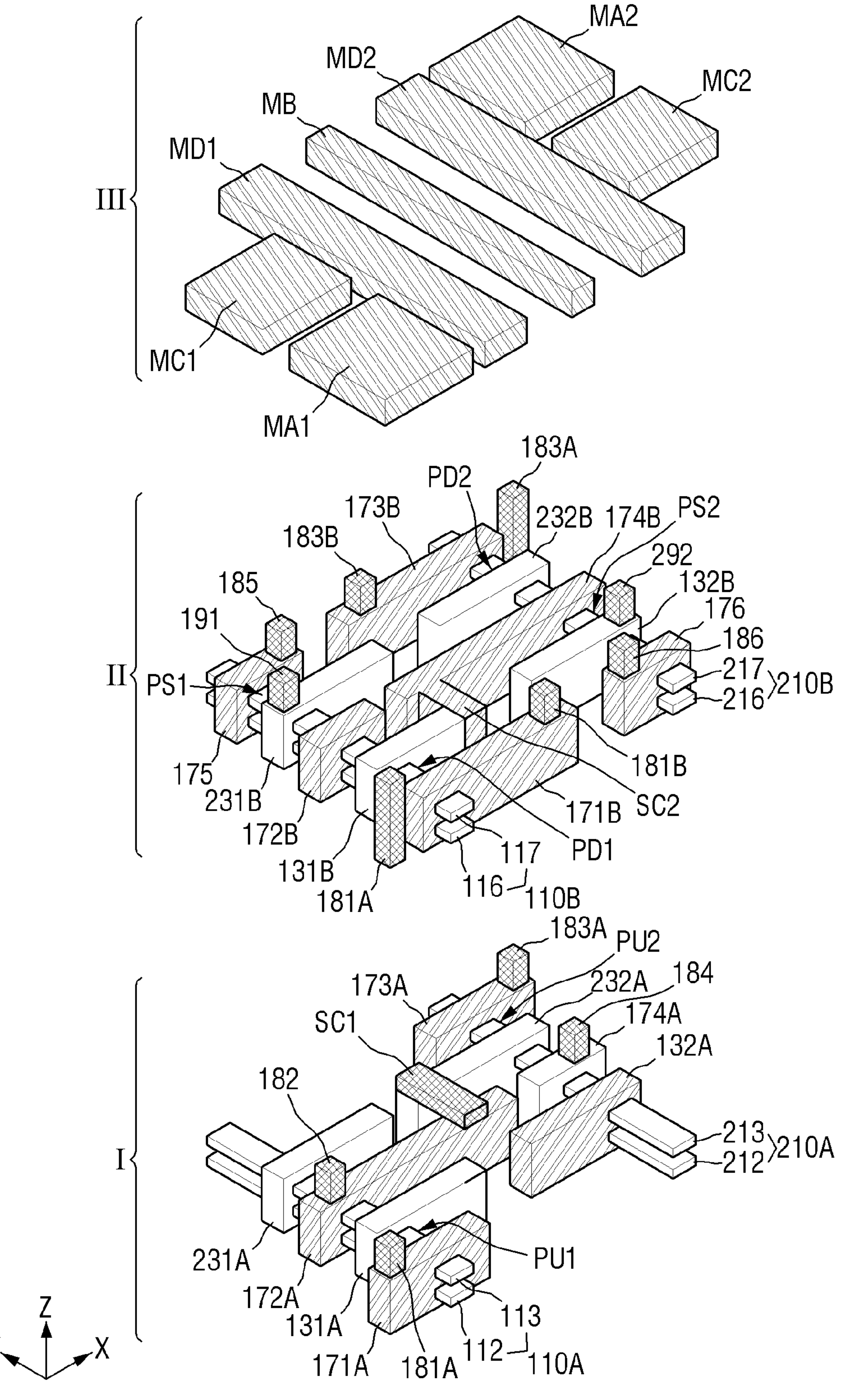
FIG. 12 is a schematic perspective view illustrating the semiconductor device of FIG. 11.

FIG. 11 is an example layout view illustrating a semiconductor device according to some embodiments of the present disclosure. FIG. 12 is a schematic perspective view illustrating the semiconductor device of FIG. 11. For convenience of description, redundant portions of those described above with reference to FIGS. 1 to 6 will be briefly described or omitted.

Referring to FIGS. 11 and 12, in the semiconductor device according to some embodiments, the lower shared contact SC1 may be formed on the upper surface of the second lower source/drain contact 172A and the upper surface of the fourth lower gate electrode 232A, and the upper shared contact SC2 may be formed on the side of the fourth upper source/drain contact 174B and the side of the first upper gate electrode 131B. Since the lower shared contact SC1 is the same as that described above with reference to FIGS. 7 and 8 and the upper shared contact SC2 is the same as that described above with reference to FIGS. 9 and 10, the detailed descriptions thereof will be omitted.

Figure 13:
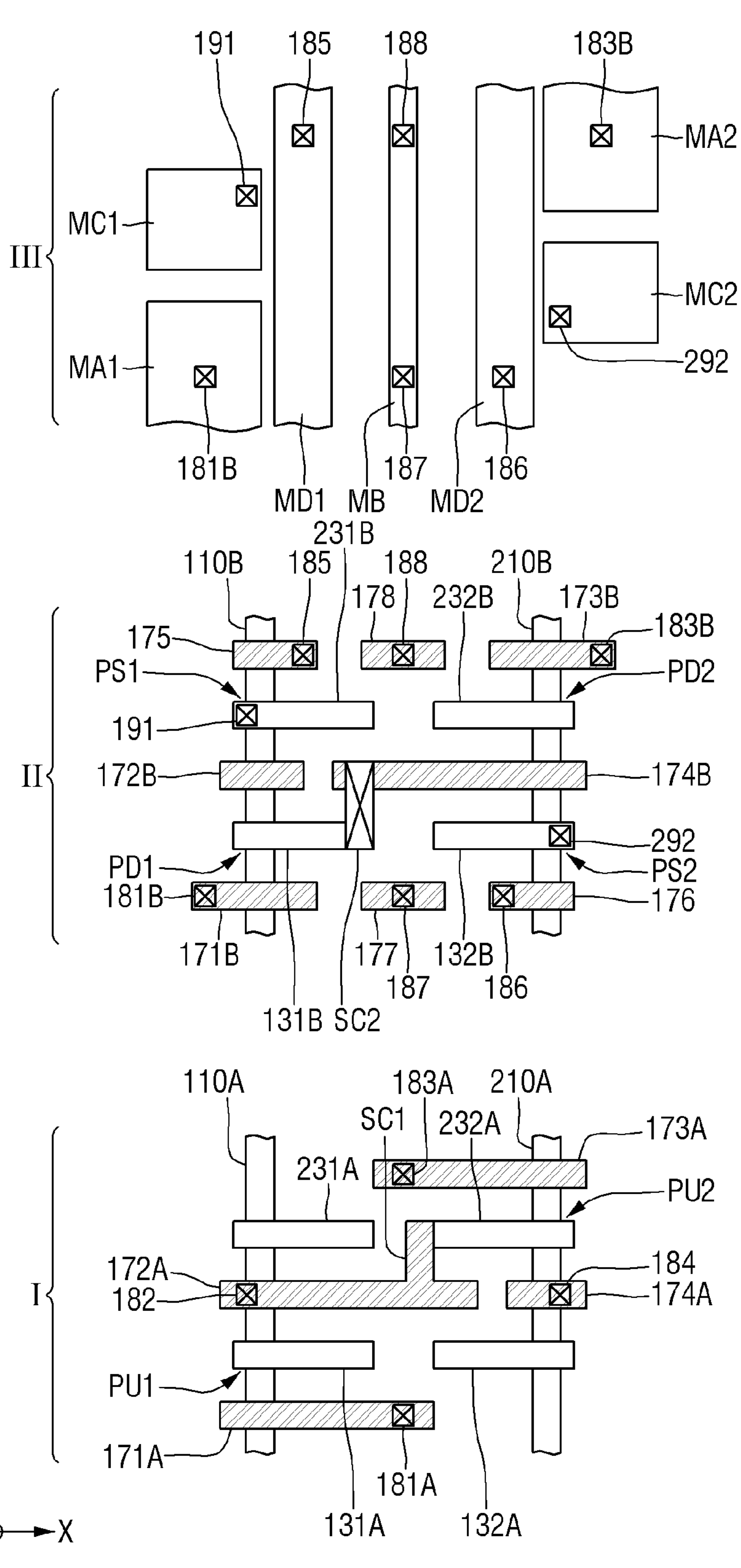
FIG. 13 is an example layout view illustrating a semiconductor device according to some embodiments of the present disclosure.
Figure 14:
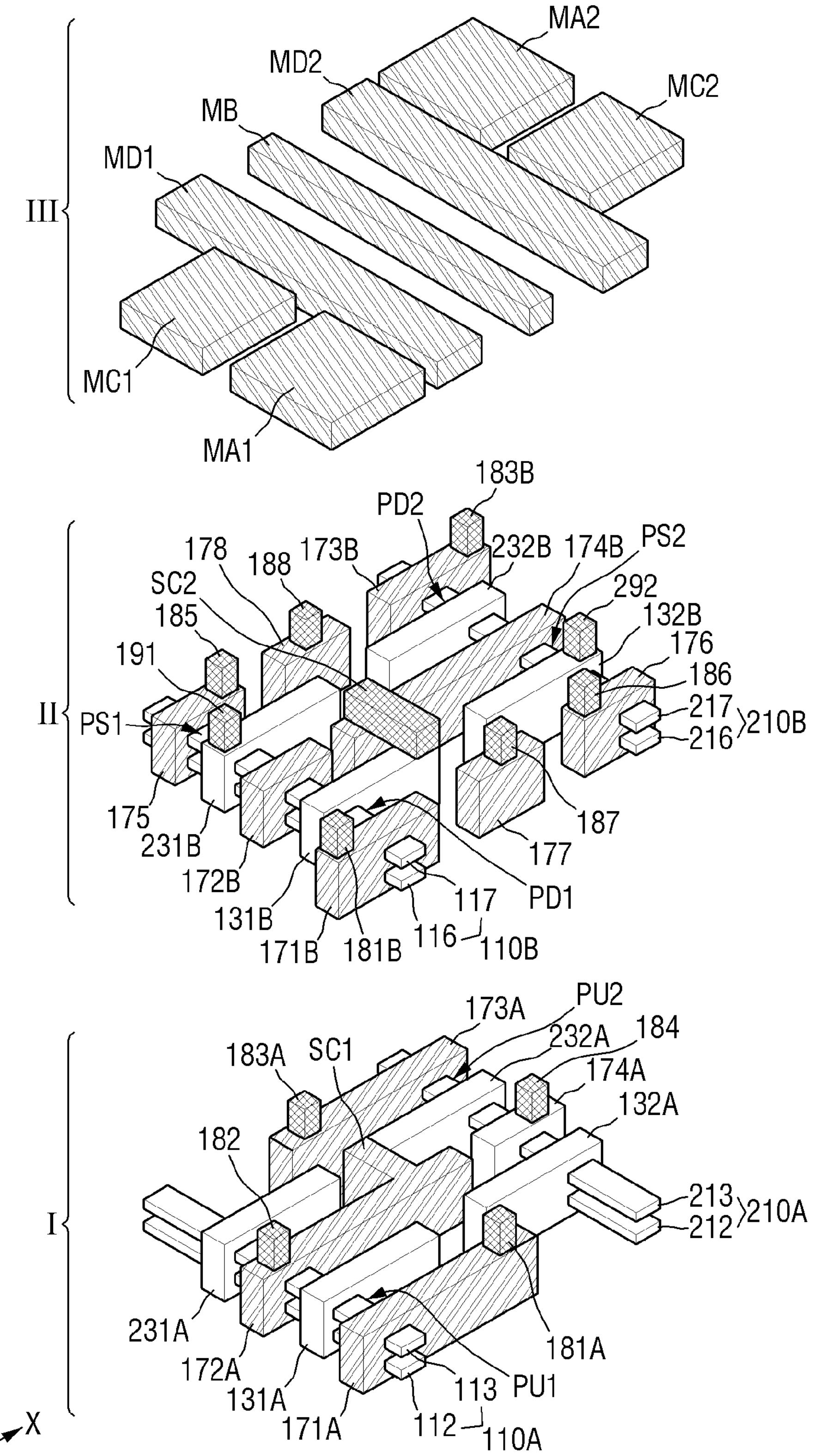
FIG. 14 is a schematic perspective view illustrating the semiconductor device of FIG. 13.

FIG. 13 is an example layout view illustrating a semiconductor device according to some embodiments of the present disclosure. FIG. 14 is a schematic perspective view illustrating the semiconductor device of FIG. 13. For convenience of description, redundant portions of those described above with reference to FIGS. 1 to 12 will be briefly described or omitted.

Referring to FIGS. 13 and 14, the semiconductor device according to some embodiments may further include a seventh upper source/drain contact 177 and an eighth upper source/drain contact 178.

The seventh upper source/drain contact 177 may be connected to the first lower source/drain contact 171A. For example, the first lower contact via 181A may connect the upper surface of the first lower source/drain contact 171A with a lower surface of the seventh upper source/drain contact 177. In some embodiments, the seventh upper source/drain contact 177 may be interposed between the first upper source/drain contact 171B and the sixth upper source/drain contact 176.

The eighth upper source/drain contact 178 may be connected to the third lower source/drain contact 173A. For example, the third lower contact via 183A may connect the upper surface of the third lower source/drain contact 173A with a lower surface of the eighth upper source/drain contact 178. In some embodiments, the eighth upper source/drain contact 178 may be interposed between the third upper source/drain contact 173B and the fifth upper source/drain contact 175.

A first signal may be provided to the first lower source/drain contact 171A and the third lower source/drain contact 173A. For example, a fifth upper contact via 187 connected to an upper surface of the seventh upper source/drain contact 177 may be formed, and a sixth upper contact via 188 connected to an upper surface of the eighth upper source/drain contact 178 may be formed. In addition, the third wiring pattern MB connected to the fifth upper contact via 187 and the sixth upper contact via 188 may be formed in the wiring region III. The third wiring pattern MB may be provided as the power node $V_{DD}$ to provide the first signal to the first lower source/drain contact 171A and the third lower source/drain contact 173A.

In some embodiments, the fifth upper contact via 187 and the sixth upper contact via 188 may be arranged along the first direction Y. The third wiring pattern MB may be extended to be long in the first direction Y to connect the fifth upper contact via 187 with the sixth upper contact via 188.

A second signal that is different from the first signal may be provided to the first upper source/drain contact 171B. For example, the first wiring pattern MA1 connected to the first upper contact via 181B may be formed in the wiring region III. The first wiring pattern MA1 may be provided as the ground node $V_{SS}$ to provide the second signal to the first upper source/drain contact 171B.

The second signal may be provided to the third upper source/drain contact 173B. For example, the second wiring pattern MA2 connected to the second upper contact via 183B may be formed in the wiring region III. The second wiring pattern MA2 may be provided as the ground node $V_{SS}$ to provide the second signal to the third upper source/drain contact 173B.

Figure 15:
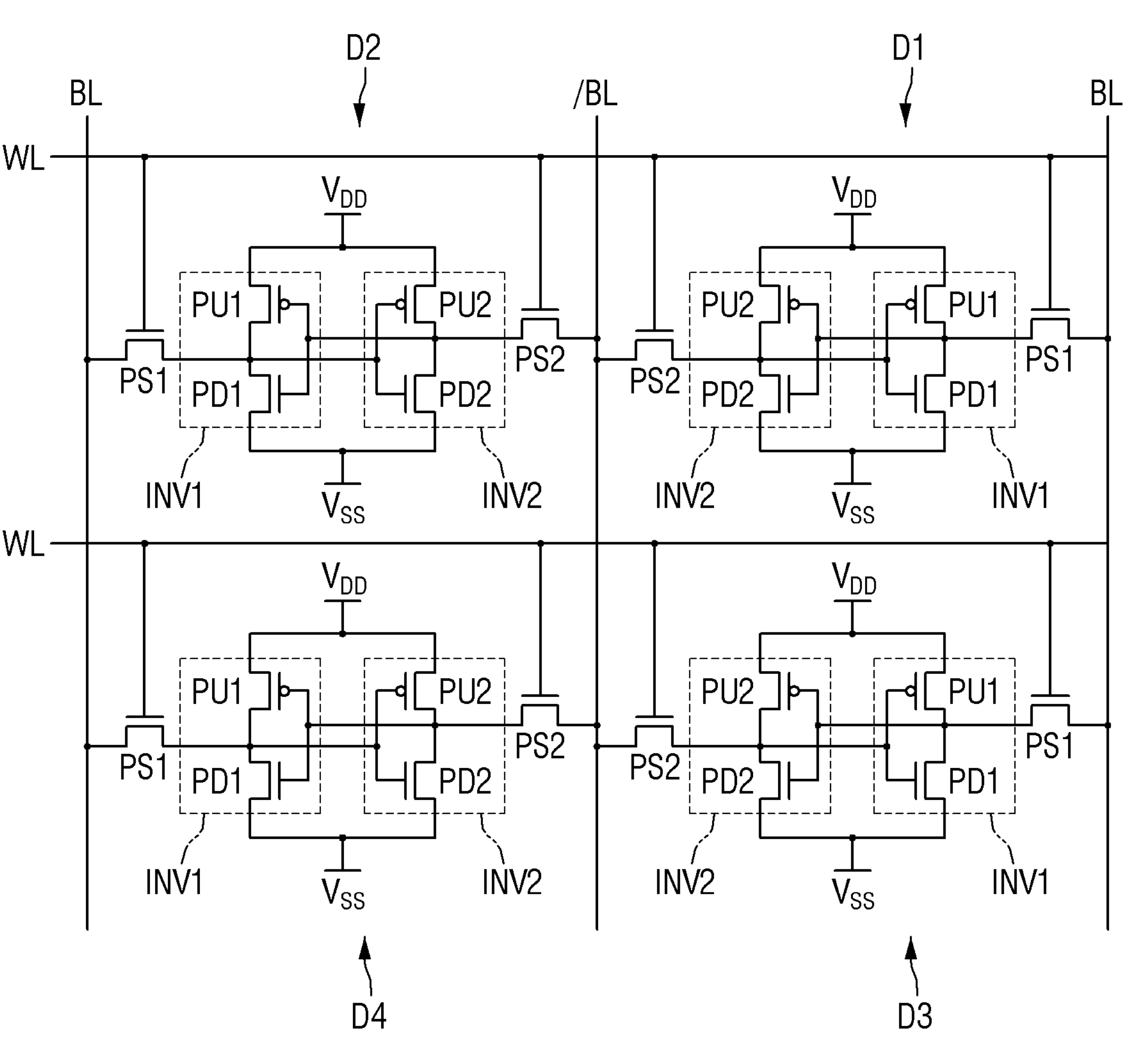
FIG. 15 is an example circuit view illustrating a semiconductor device according to some embodiments of the present disclosure.
Figure 16:
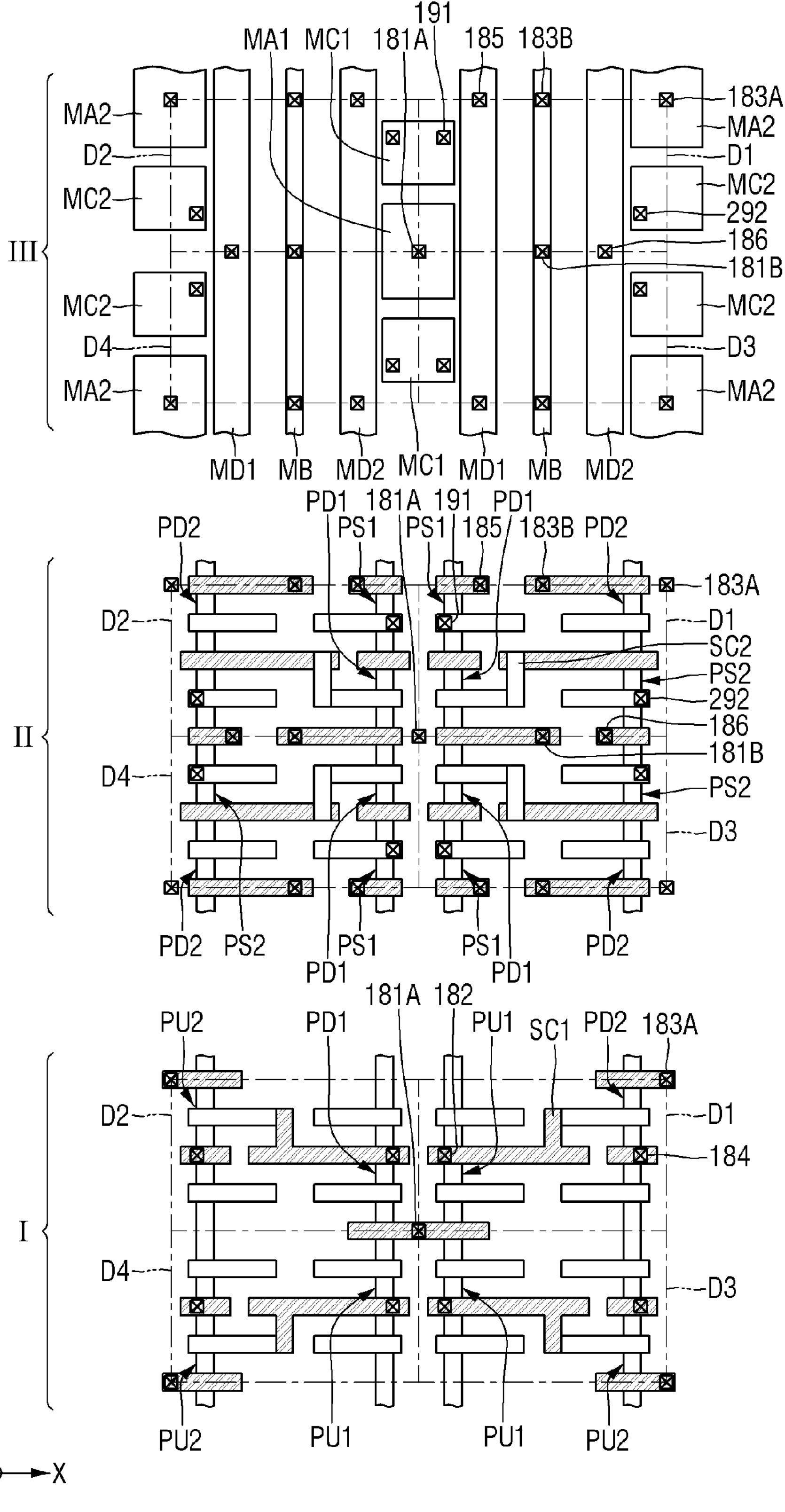
FIGS. 16 and 17 are various example layout views illustrating a semiconductor device according to some embodiments of the present disclosure.
Figure 17:
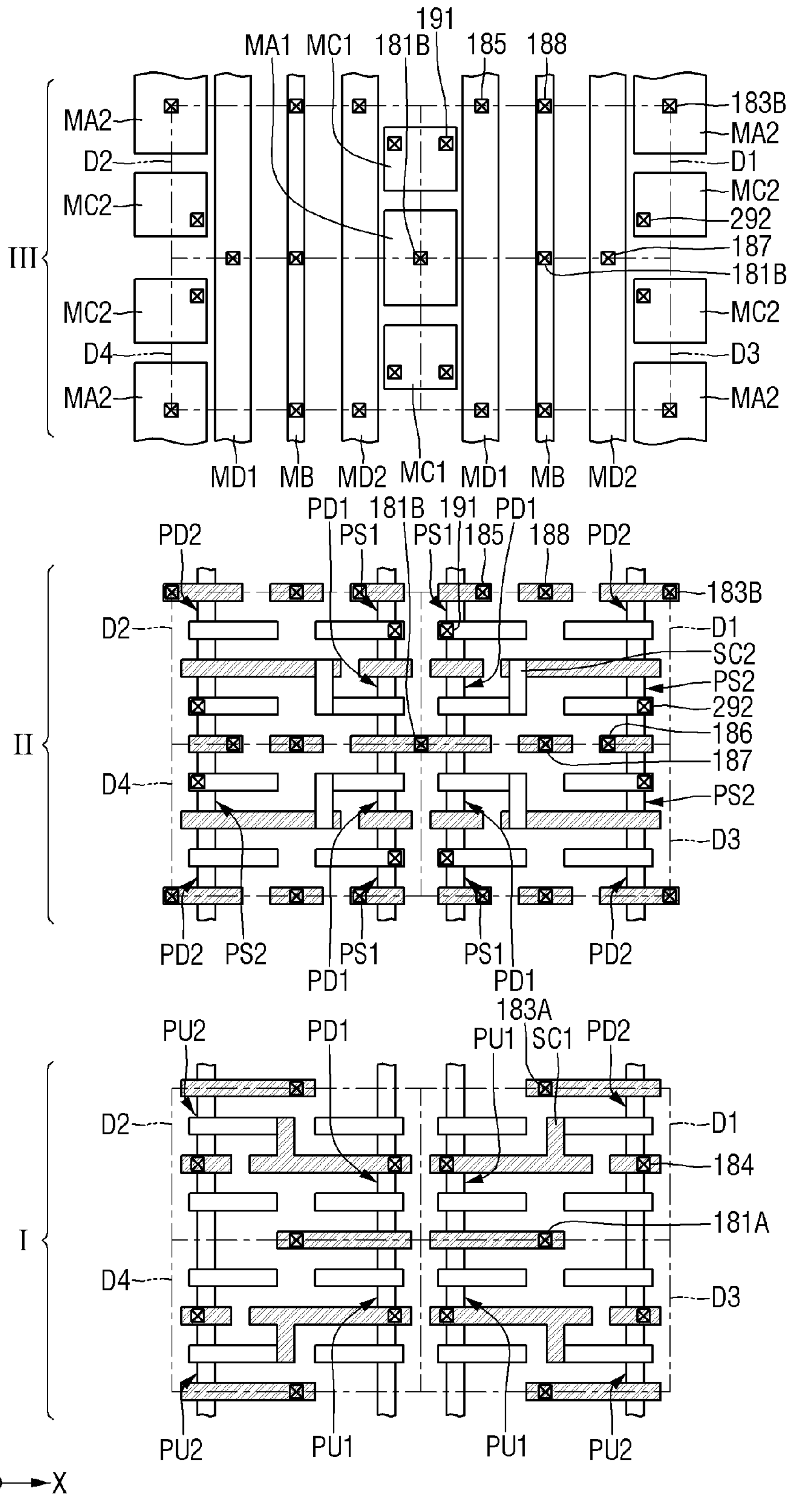

FIG. 15 is an example circuit view illustrating a semiconductor device according to some embodiments of the present disclosure. FIGS. 16 and 17 are various example layout views illustrating a semiconductor device according to some embodiments of the present disclosure. For convenience of description, redundant portions of those described above with reference to FIGS. 1 to 14 will be briefly described or omitted.

Referring to FIG. 15, the semiconductor device according to some embodiments may include first to fourth unit elements D1 to D4 that are adjacent to one another.

Each of the first to fourth unit elements D1 to D4 may include a pair of inverters INV1 and INV2 connected in parallel between a power node $V_{DD}$ and a ground node $V_{SS}$, and first and second pass transistors PS1 and PS2 respectively connected to the output nodes of the inverters INV1 and INV2.

In some embodiments, the first to fourth unit elements D1 to D4 may share one complementary bit line/BL. For example, two bit lines BL extended in parallel may be formed on both sides of one complementary bit line/BL. The first unit element D1 and the third unit element D3 may be defined between one of the two bit lines BL and the complementary bit line/BL, and the second unit element D2 and the fourth unit element D4 may be defined between the other one of the two bit lines BL and the complementary bit line/BL.

In some embodiments, the first unit element D1 and the second unit element D2 may share one word line WL, and the third unit element D3 and the fourth unit element D4 may share another word line WL.

Referring to FIGS. 15 to 17, in the semiconductor device according to some embodiments, each of the first to fourth unit elements D1 to D4 may include a lower region I, an upper region II and a wiring region III. Since the first to fourth unit elements D1 to D4 of FIG. 16 are the same as those described above with reference to FIGS. 2 to 6, their detailed descriptions will be omitted. In addition, since the first to fourth unit elements D1 to D4 of FIG. 17 are the same as those described above with reference to FIGS. 13 and 14, their detailed descriptions will be omitted.

In some embodiments, the first to fourth unit elements D1 to D4 may share the first wiring pattern MA1. For example, the first to fourth unit elements D1 to D4 may share one first lower contact via 181A connected to one first wiring pattern MA1. In addition, the first to fourth unit elements D1 to D4 may be arranged symmetrically based on the first lower contact via 181A.

In some embodiments, the first unit element D1 and the second unit element D2 may share the fourth wiring pattern MC1. For example, the first gate contact 191 of the first unit element D1 and the first gate contact 191 of the second unit element D2 may be commonly connected to one fourth wiring pattern MC1. Likewise, the third unit element D3 and the fourth unit element D4 may share the fourth wiring pattern MC1.

In some embodiments, the first unit element D1 and the third unit element D3 may share the third wiring pattern MB, the sixth wiring pattern MD1 and the seventh wiring pattern MD2. For example, the first unit element D1 and the third unit element D3 may share one first upper contact via 181B connected to one third wiring pattern MB. The second upper contact via 183B of the first unit element D1 and the second upper contact via 183B of the third unit element D3 may be commonly connected to one third wiring pattern MB. For example, the third upper contact via 185 of the first unit element D1 and the third upper contact via 185 of the third unit element D3 may be commonly connected to one sixth wiring pattern MD1. For example, the first unit element D1 and the third unit element D3 may share one fourth upper contact via 186 connected to one seventh wiring pattern MD2. Likewise, the second unit element D2 and the fourth unit element D4 may share the third wiring pattern MB, the sixth wiring pattern MD1 and the seventh wiring pattern MD2.

While the present disclosure has been particularly shown and described with reference to example embodiments thereof, it will be understood by those of ordinary skill in the art that various changes in form and details may be made therein without departing from the spirit and scope of the present disclosure as defined by the following claims. It is therefore desired that the present embodiments be considered in all respects as illustrative and not restrictive, reference being made to the appended claims rather than the foregoing description to indicate the scope of the present disclosure.

What is claimed is:

1. A semiconductor device comprising a lower region and an upper region on a substrate, the semiconductor device comprising:

a first lower active pattern and a second lower active pattern that extend in a first direction, extend in the lower region, and are spaced apart from each other in a second direction that intersects the first direction;

a first upper active pattern and a second upper active pattern that extend in the first direction, extend in the upper region, and are spaced apart from each other in the second direction;

a first gate electrode that overlaps the first lower active pattern and the first upper active pattern;

a second gate electrode spaced apart from the first gate electrode in the second direction, wherein the second gate electrode overlaps at least one of the second lower active pattern and the second upper active pattern;

a third gate electrode spaced apart from the first gate electrode in the first direction, wherein the third gate electrode overlaps at least one of the first lower active pattern and the first upper active pattern;

a fourth gate electrode spaced apart from the third gate electrode in the second direction, wherein the fourth gate electrode overlaps the second lower active pattern and the second upper active pattern;

a first lower source/drain contact that is electrically connected to the first lower active pattern and is between the first gate electrode and the third gate electrode;

a first upper source/drain contact that is electrically connected to the second upper active pattern and is between the second gate electrode and the fourth gate electrode;

a lower shared contact in the lower region, wherein the lower shared contact is electrically connected to the first lower source/drain contact and the fourth gate electrode; and an upper shared contact in the upper region, wherein the upper shared contact is electrically connected to the first upper source/drain contact and the first gate electrode.

2. The semiconductor device of claim 1, wherein the lower shared contact extends from a side surface of the first lower source/drain contact and is electrically connected to a side surface of the fourth gate electrode.

3. The semiconductor device of claim 2, wherein the lower shared contact extends in the first direction.

4. The semiconductor device of claim 1, wherein the upper shared contact is on an upper surface of the first upper source/drain contact and an upper surface of the first gate electrode.

5. The semiconductor device of claim 4, wherein the lower shared contact extends in the first direction.

6. The semiconductor device of claim 1, further comprising a cutting pattern that extends in the first direction, separates the first gate electrode and the second gate electrode, and separates the third gate electrode and the fourth gate electrode.

7. The semiconductor device of claim 6, wherein a length of the first gate electrode in the second direction is the same as a length of the third gate electrode in the second direction, and a length of the second gate electrode in the second direction is the same as a length of the fourth gate electrode in the second direction.

8. The semiconductor device of claim 1, further comprising:

a second upper source/drain contact that is electrically connected to the first upper active pattern and is between the first gate electrode and the third gate electrode; and a second lower source/drain contact that is electrically connected to the second lower active pattern and is between the second gate electrode and the fourth gate electrode, wherein the first lower source/drain contact is electrically connected to the second upper source/drain contact, and the first upper source/drain contact is electrically connected to the second lower source/drain contact.

9. A semiconductor device comprising a lower region and an upper region on a substrate, the semiconductor device comprising:

a first lower active pattern and a second lower active pattern that extend in a first direction, extend in the lower region, and are spaced apart from each other in a second direction that intersects the first direction;

a first upper active pattern and a second upper active pattern that extend in the first direction, extend in the upper region, and are spaced apart from each other in the second direction;

a first gate electrode that overlaps the first lower active pattern and the first upper active pattern;

a second gate electrode that overlaps the second lower active pattern and the second upper active pattern, wherein the second gate electrode does not overlap the first gate electrode in the second direction;

a first lower source/drain contact that is electrically connected to the first lower active pattern and is between the first gate electrode and the second gate electrode;

a first upper source/drain contact that is electrically connected to the first upper active pattern and on the first lower source/drain contact;

a second lower source/drain contact that is spaced apart from the first lower source/drain contact in the second direction and is electrically connected to the second lower active pattern;

a second upper source/drain contact spaced apart from the first upper source/drain contact in the second direction and electrically connected to the second upper active pattern;

a lower shared contact in the lower region, wherein the lower shared contact is electrically connected to the first lower source/drain contact and the second gate electrode; and an upper shared contact in the upper region, wherein the upper shared contact is electrically connected to the second upper source/drain contact and the first gate electrode.

10. The semiconductor device of claim 9, wherein the first lower source/drain contact is electrically connected to the first upper source/drain contact, and the second lower source/drain contact is electrically connected to the second upper source/drain contact.

11. The semiconductor device of claim 9, wherein a length of the first lower source/drain contact in the second direction is greater than a length of the second lower source/drain contact in the second direction.

12. The semiconductor device of claim 9, wherein a length of the second upper source/drain contact in the second direction is greater than a length of the first upper source/drain contact in the second direction.

13. The semiconductor device of claim 9, further comprising:

a third lower source/drain contact, wherein the first gate electrode is between the first lower source/drain contact and the third lower source/drain contact, and wherein the third lower source/drain contact is electrically connected to the first lower active pattern; and a third upper source/drain contact that is on the third lower source/drain contact and is electrically connected to the first upper active pattern, wherein the third lower source/drain contact is configured to receive a first signal comprising a first voltage, and the third upper source/drain contact is configured to receive a second signal comprising a second voltage.

14. The semiconductor device of claim 13, further comprising:

a fourth lower source/drain contact, wherein the second gate electrode is between the second lower source/drain contact and the fourth lower source/drain contact, and wherein the fourth lower source/drain contact is electrically connected to the second lower active pattern; and a fourth upper source/drain contact that is on the fourth lower source/drain contact and is electrically connected to the second upper active pattern, wherein the fourth lower source/drain contact is configured to receive the first signal, and the fourth upper source/drain contact is configured to receive the second signal.

15. A semiconductor device comprising:

a substrate;

a first active pattern comprising a first lower active pattern and a first upper active pattern that are on the substrate, are spaced apart from each other, and extend in a first direction;

a second active pattern comprising a second lower active pattern and a second upper active pattern that are on the substrate, spaced apart from each other, and extend in the first direction, wherein the second active pattern is spaced apart from the first active pattern in a second direction that intersects the first direction;

a cutting pattern that extends in the first direction and is between the first active pattern and the second active pattern;

a first gate structure that extends in the second direction, the first gate structure comprising a first gate electrode that overlaps the first active pattern and a second gate electrode that overlaps the second active pattern, wherein the first gate electrode and the second gate electrode are separated by the cutting pattern;

a second gate structure that is spaced apart from the first gate structure and extends in the second direction, the second gate structure comprising a third gate electrode that overlaps the first active pattern and a fourth gate electrode that overlaps the second active pattern, wherein the third gate electrode and the fourth gate electrode are separated by the cutting pattern;

a first lower source/drain contact that is electrically connected to the first lower active pattern and is between the first gate electrode and the third gate electrode;

a first upper source/drain contact that is electrically connected to the first lower source/drain contact and the first upper active pattern and is on the first lower source/drain contact;

a second lower source/drain contact that is electrically connected to the second lower active pattern and is between the second gate electrode and the fourth gate electrode;

a second upper source/drain contact that is electrically connected to the second lower source/drain contact and the second upper active pattern and is on the second lower source/drain contact;

a lower shared contact that extends in the first direction and is electrically connected to the first lower source/drain contact and the fourth gate electrode; and an upper shared contact that extends in the first direction and is electrically connected to the second upper source/drain contact and the first gate electrode.

16. The semiconductor device of claim 15, wherein a first distance between an upper surface of the lower shared contact and an upper surface of the substrate is less than a second distance between a lower surface of the second upper source/drain contact and the upper surface of the substrate.

17. The semiconductor device of claim 15, wherein a first distance between a lower surface of the upper shared contact and an upper surface of the substrate is greater than a second distance between an upper surface of the first lower source/drain contact and the upper surface of the substrate.

18. The semiconductor device of claim 15, wherein at least a portion of the lower shared contact overlaps the cutting pattern in a third direction that intersects an upper surface of the substrate.

19. The semiconductor device of claim 15, wherein the upper shared contact does not overlap the cutting pattern in a third direction that intersects an upper surface of the substrate.

20. The semiconductor device of claim 15, further comprising:

a third lower source/drain contact, wherein the first gate electrode is between the first lower source/drain contact and the third lower source/drain contact, and wherein the third lower source/drain contact is electrically connected to the first lower active pattern;

a third upper source/drain contact that is electrically connected to the first upper active pattern and is on the third lower source/drain contact;

a fourth lower source/drain contact, wherein the fourth gate electrode is between the second lower source/drain contact and the fourth lower source/drain contact, and wherein the fourth lower source/drain contact is electrically connected to the second lower active pattern; and a fourth upper source/drain contact that is electrically connected to the second upper active pattern and is on the fourth lower source/drain contact, wherein the third lower source/drain contact and the fourth lower source/drain contact are configured to receive a first signal comprising a first voltage, and wherein the third upper source/drain contact and the fourth upper source/drain contact are configured to receive a second signal comprising a second voltage.

* * * * *